US010598360B2

(12) United States Patent
Zaderej et al.

(10) Patent No.: US 10,598,360 B2
(45) Date of Patent: **\*Mar. 24, 2020**

(54) SEMICONDUCTOR ASSEMBLY

(71) Applicant: Molex, LLC, Lisle, IL (US)

(72) Inventors: Victor Zaderej, Wheaton, IL (US); Daniel B. McGowan, Glen Ellyn, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/266,675

(22) Filed: Feb. 4, 2019

(65) Prior Publication Data

US 2019/0178481 A1    Jun. 13, 2019

Related U.S. Application Data

(63) Continuation of application No. 14/777,106, filed on Sep. 15, 2015, now Pat. No. 10,197,256.

(51) Int. Cl.
| | |
|---|---|
| *F21V 23/06* | (2006.01) |
| *F21S 4/00* | (2016.01) |
| *F21V 23/00* | (2015.01) |
| *F21S 4/28* | (2016.01) |
| *F21K 9/20* | (2016.01) |
| *F21V 19/00* | (2006.01) |
| *H05K 1/00* | (2006.01) |
| *H01L 25/075* | (2006.01) |
| *F21Y 103/10* | (2016.01) |

(Continued)

(52) U.S. Cl.
CPC .............. *F21V 23/001* (2013.01); *F21K 9/20* (2016.08); *F21S 4/28* (2016.01); *F21V 19/0025* (2013.01); *F21V 23/06* (2013.01); *H01L 25/0753* (2013.01); *H05K 1/00* (2013.01); *F21Y 2103/10* (2016.08); *F21Y 2115/10* (2016.08); *H01L 33/62* (2013.01)

(58) Field of Classification Search
CPC ........... F21S 4/28; F21V 23/001; F21V 23/06
See application file for complete search history.

(56) References Cited

U.S. PATENT DOCUMENTS

| | | |
|---|---|---|
| 7,903,197 B2 | 3/2011 | Koganezawa |
| 8,641,256 B2 | 2/2014 | Sano et al. |
| 9,040,332 B2 | 5/2015 | Moran et al. |

(Continued)

FOREIGN PATENT DOCUMENTS

| | | |
|---|---|---|
| CN | 101226259 A | 7/2008 |
| CN | 101375586 A | 2/2009 |

(Continued)

OTHER PUBLICATIONS

International Search Report and written opinion received for PCT Application No. PCT/US2014/028652, dated Jul. 28, 2014, 7 pages.

(Continued)

*Primary Examiner* — Karabi Guharay
(74) *Attorney, Agent, or Firm* — Molex, LLC

(57) ABSTRACT

An assembly is provided that includes a semiconductor device positioned on a frame and connected to electroplated traces via wire bonding. A connector can be integrated into the frame. Terminals can be molded into the frame. Traces can be connected to the terminals so as to provide a three-dimensional circuit.

14 Claims, 26 Drawing Sheets

(51) Int. Cl.
*F21Y 115/10* (2016.01)
*H01L 33/62* (2010.01)

(56) References Cited

U.S. PATENT DOCUMENTS

| | | | |
|---|---|---|---|
| 10,197,256 B2* | 2/2019 | Zaderej | F21V 19/0025 |
| 2008/0101093 A1 | 5/2008 | Yoon et al. | |
| 2009/0139755 A1 | 6/2009 | Kusano et al. | |
| 2010/0127283 A1 | 5/2010 | Van De Ven et al. | |
| 2010/0182293 A1 | 7/2010 | Minamino et al. | |
| 2011/0108747 A1 | 5/2011 | Liu | |
| 2012/0182497 A1 | 7/2012 | Qi et al. | |
| 2012/0294037 A1 | 11/2012 | Holman et al. | |
| 2013/0038246 A1 | 2/2013 | Sasano | |
| 2015/0023539 A1* | 1/2015 | Bauman | H04R 25/658 381/324 |

FOREIGN PATENT DOCUMENTS

| | | |
|---|---|---|
| CN | 101377586 A | 3/2009 |
| KR | 10-2011-0095868 A | 8/2011 |
| WO | 2009/004894 A1 | 1/2009 |
| WO | 2011/129202 A1 | 10/2011 |
| WO | 2012/049600 A1 | 4/2012 |
| WO | 2014/144305 A1 | 9/2014 |

OTHER PUBLICATIONS

International Preliminary Report on Patentability received for PCT Application No. PCT/US2014/028652, dated Sep. 24, 2015, 6 pages.
Non Final Action received for U.S. Appl. No. 14/777,106, dated Apr. 19, 2017, 8 pages.
Final Office Action received for U.S. Appl. No. 14/777,106, dated Nov. 16, 2017, 7 pages.
Non Final Action received for U.S. Appl. No. 14/777,106, dated May 10, 2018, 7 pages.
Notice of Allowance received for U.S. Appl. No. 14/777,106, dated Sep. 21, 2018, 7 pages.

* cited by examiner

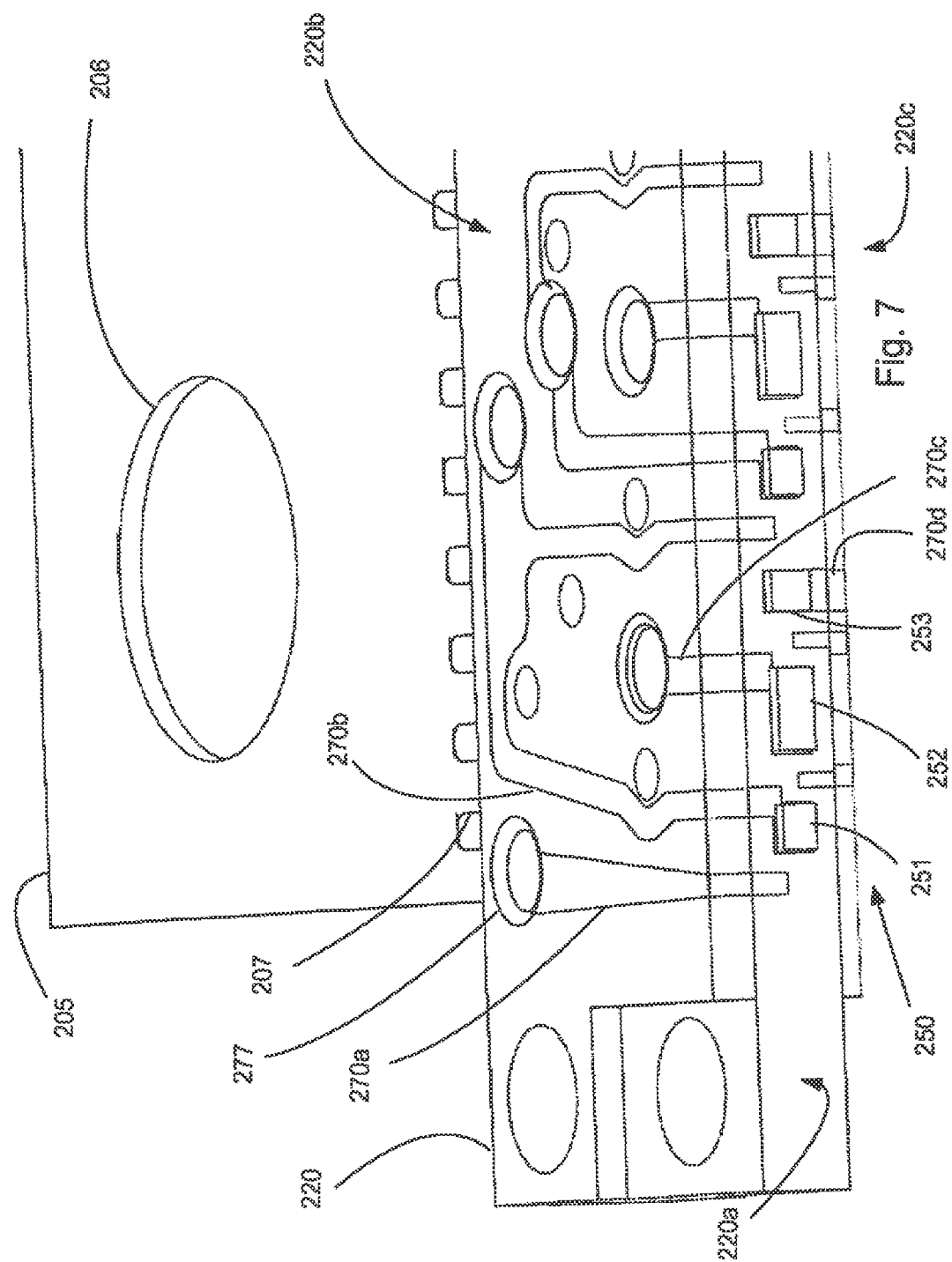

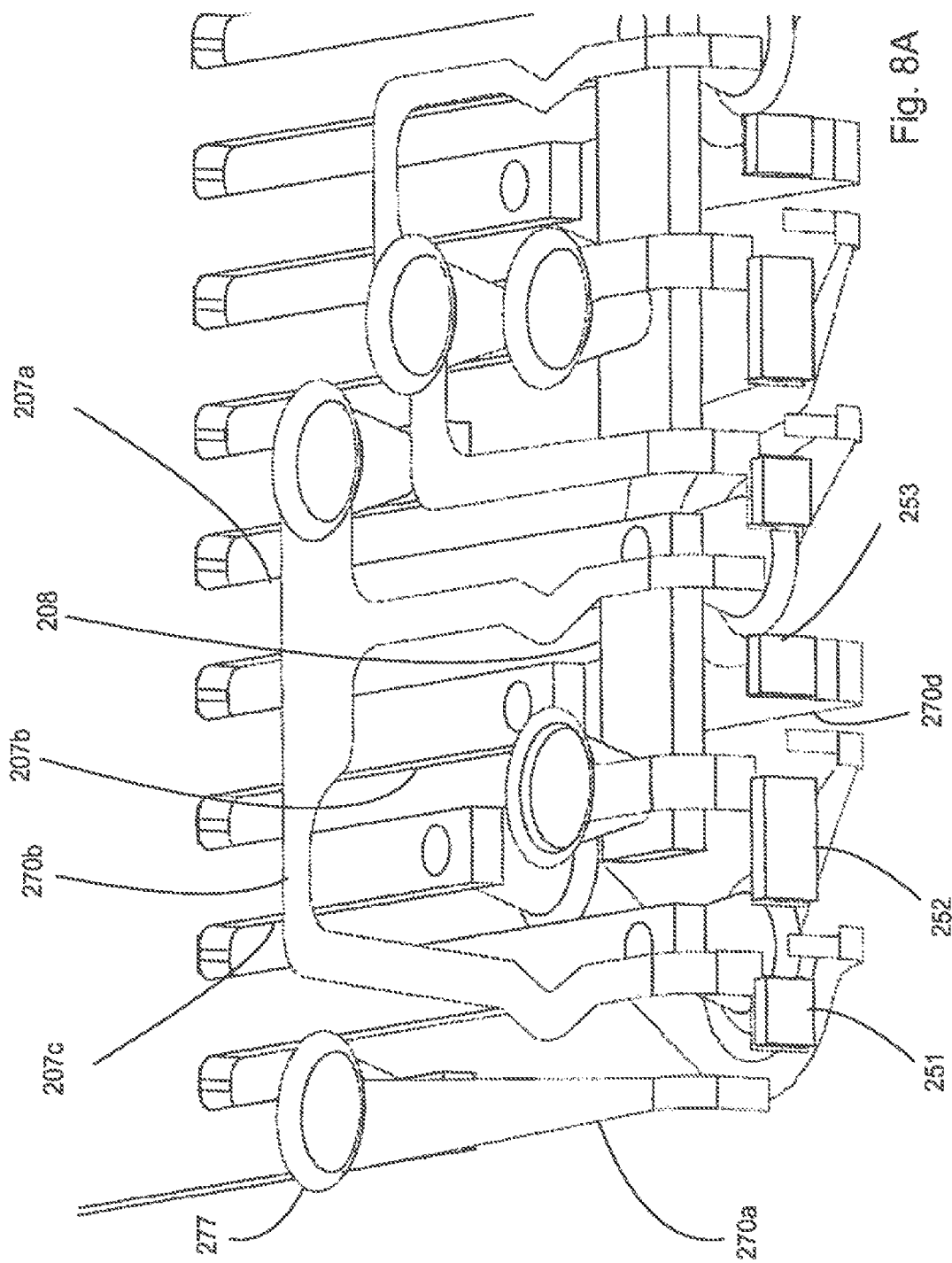

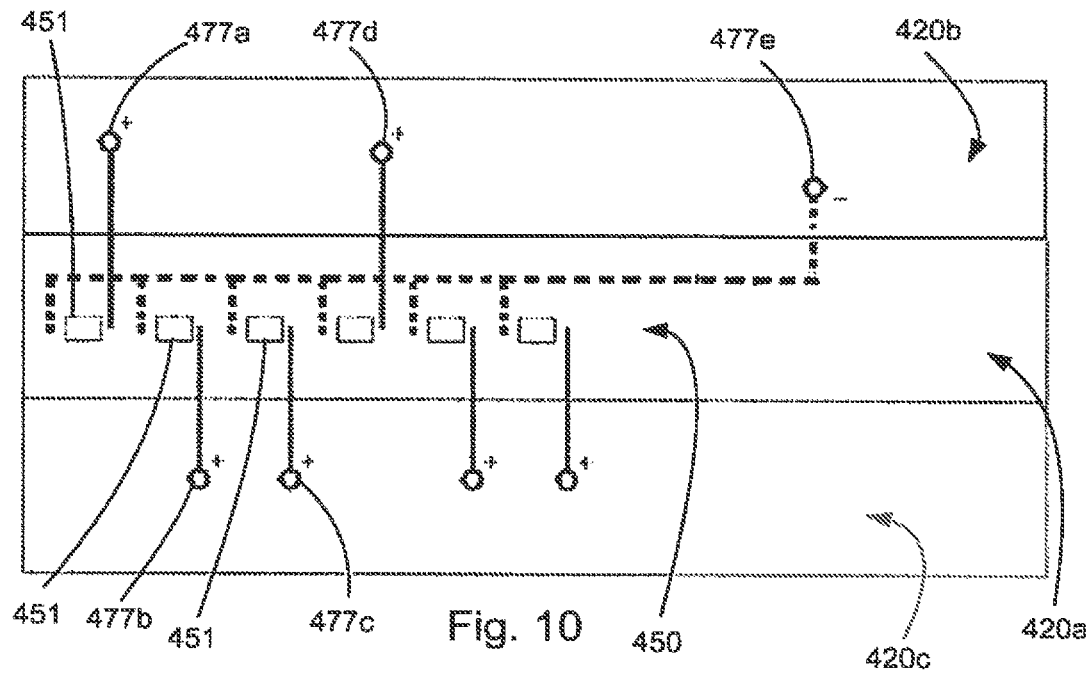
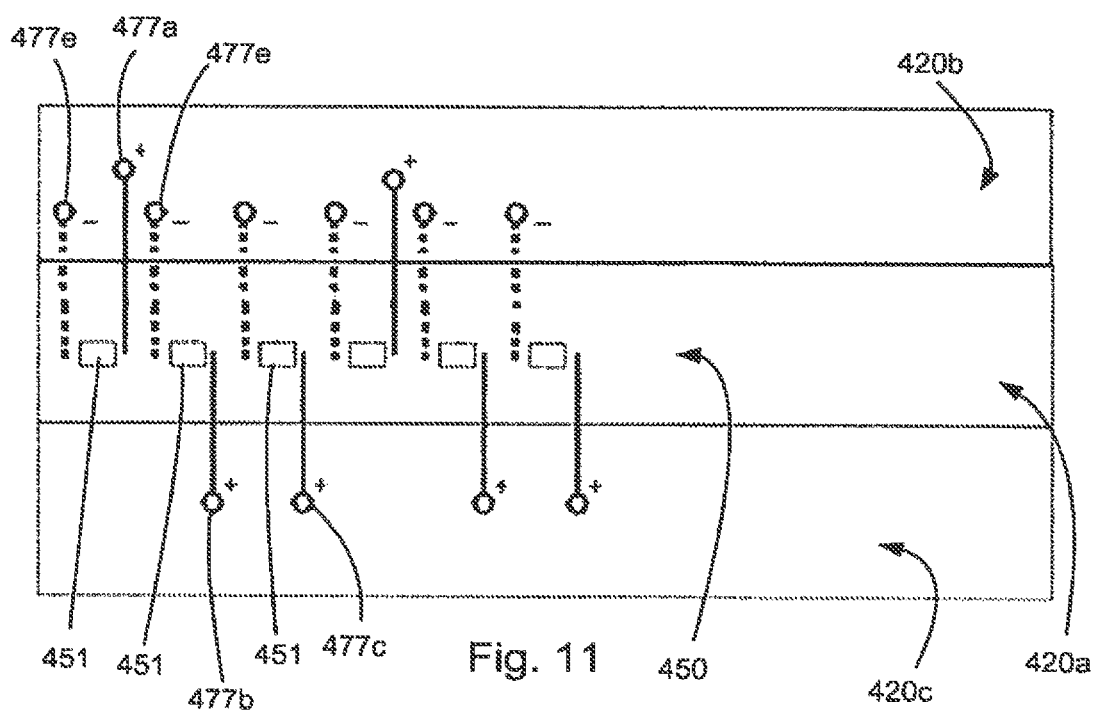

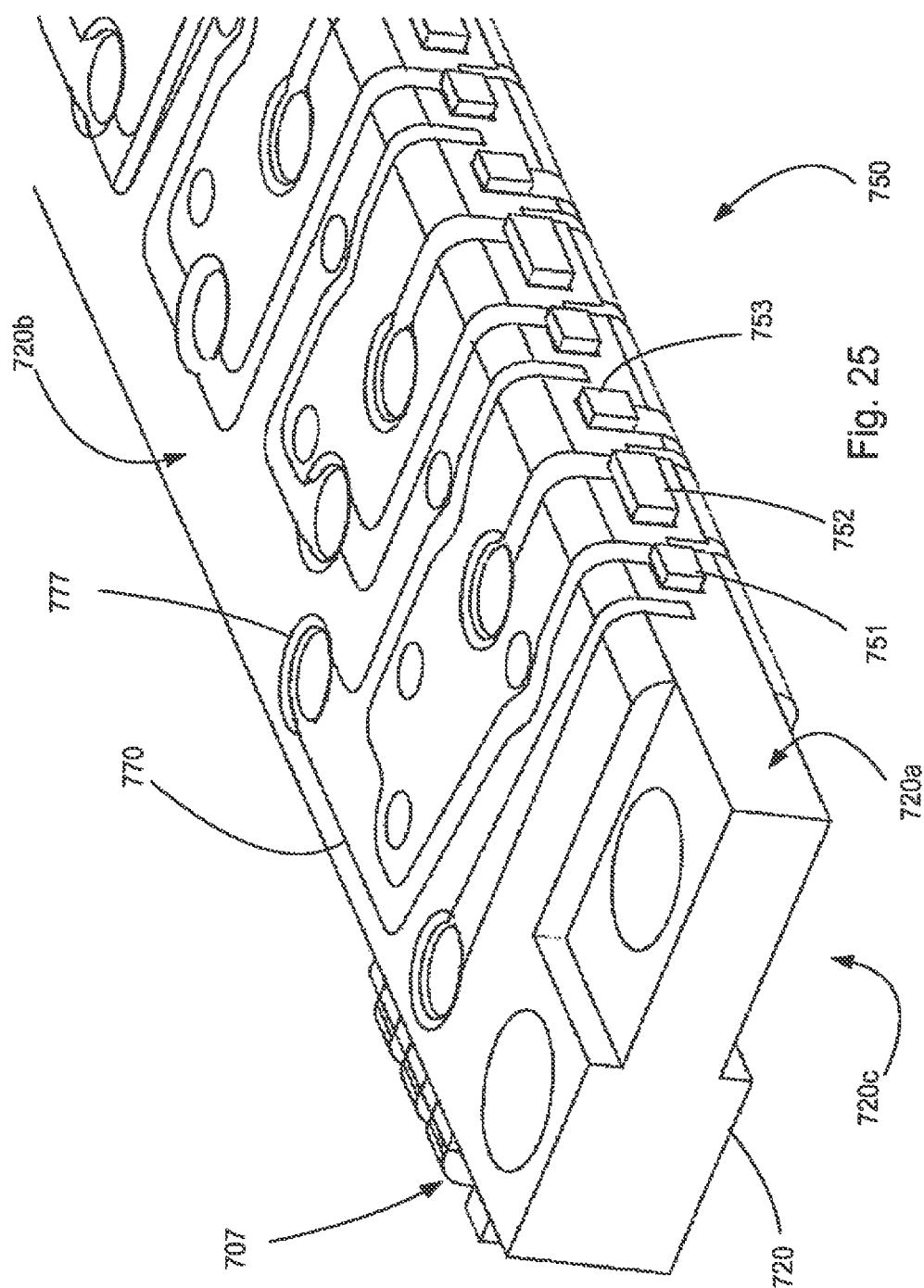

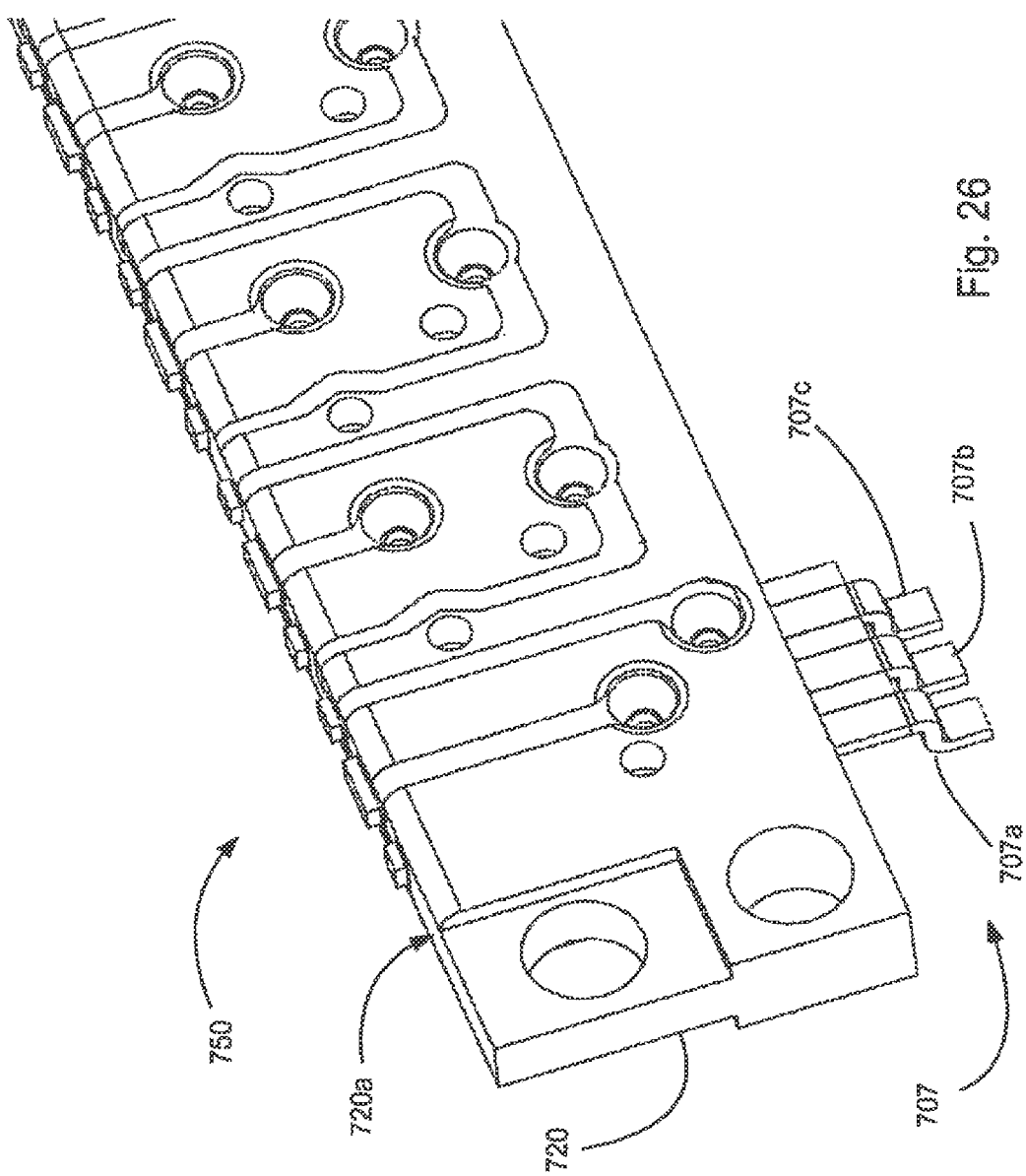

SEMICONDUCTOR ASSEMBLY

RELATED APPLICATIONS

This application claims priority to U.S. application Ser. No. 14/777,106, filed 15 Sep. 2015, now U.S. Pat. No. 10,197,256, which is a national phase of PCT Application No. PCT/US2014/028652, filed 14 Mar. 2014, which in turn claims priority to U.S. Provisional Appln. No. 61/787,420, filed 15 Mar. 2013, to U.S. Provisional Appln. No. 61/888,866, filed 9 Oct. 2013, and to U.S. Provisional Appln. No. 61/914,238, filed 10 Dec. 2013, all of which are incorporated herein by reference in their entirety.

FIELD OF THE INVENTION

The present invention relates to the field of semiconductor assemblies, such as those designs directed toward illumination with LEDs.

DESCRIPTION OF RELATED ART

LEDs are useful for a number of applications. One application that has been quite successful in implementing LEDs is in displays. LEDs, because of their long life, tend to be quite beneficial for use in applications such as large flat-screen TVs, mobile devices and anything in between. For mobile devices, one major concern is the efficiency of the display as there is a limited ability to provide power. This has become more interesting to manufactures as mobile device are designed with larger screens so that users can do more with their mobile devices.

Many mobile devices tend to use a back-lit LCD display with LEDs on the edge to provide the illumination (e.g., an edge-lit design). This currently entails supporting a number of LEDs and ensuring that the LEDs are configured so that their output is directed toward a light guide that is intended to provide a uniform white light emission behind a number of LCD elements that filter the light (so as to emit the desired color on the display). Because the LCD elements control the color, it is desirable to have the light from the LEDs be white. As most LEDs emit light in a fairly narrow band (e.g., are blue or red or green), this can be done by having a phosphor convert light from LEDs into white. This is somewhat inefficient, however, and therefore, if the LEDs are red, bluer and green then by allow the different colors of light to mix in the light guide it is possible to provide white light without the loses inherent in a phosphor-type solution. Packaging all the LEDs on the side, however, remains problematic. Certain individuals, therefore, would appreciate a design that could provide high levels of efficiency in a more convenient package.

BRIEF SUMMARY

An assembly is provided that includes a semiconductor device mounted on a frame. The semiconductor device can include, for example, red LEDs, green LEDs and blue LEDs. In an embodiment the frame can include a common ground and a separate power trace for each color so that the output of each color can be controlled separately. If desired, the LEDs can be selectively controlled so that different LEDs on the frame provide different levels of illumination. A connector can be integrated into the frame. Terminals can be insert-molded into the frame and extend into the integral connector or out a back side of the frame. The traces can be connected to the terminals with vias to form desired circuit patterns. The traces can be electroplated. In an embodiment, a flex member can be used in place of terminals.

BRIEF DESCRIPTION OF THE DRAWINGS

The present invention is illustrated by way of example and not limited in the accompanying figures in which like reference numerals indicate similar elements and in which:

FIG. 7 illustrates an enlarged perspective view of the embodiment depicted in FIG. 6.

FIG. 8A illustrates a simplified perspective view of the embodiment depicted in FIG. 6.

FIG. 10 illustrates another schematic diagram of an embodiment of an LED assembly.

FIG. 11 illustrates another schematic diagram of an embodiment of an LED assembly.

FIG. 25 illustrates an enlarged perspective view of the embodiment depicted in FIG. 23.

FIG. 26 illustrates another perspective view of the embodiment depicted in FIG. 25.

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As can be appreciated, the depicted embodiments help provide a compact design that allows for high levels of control of LEDs (thus local dimming is readily attainable) while still ensuring desirable levels of efficiency. Compared to convention designs it is expected that the disclosed designs can offer improvements of more than 10% efficiency and many cases the improvements can be greater than 20%, depending on the performance of the LEDs being used. Thus, the depicted designs have the potential to allow for a substantial increase in usable life of an end device and will also allow the end device to be made more compactly.

Figure 1:
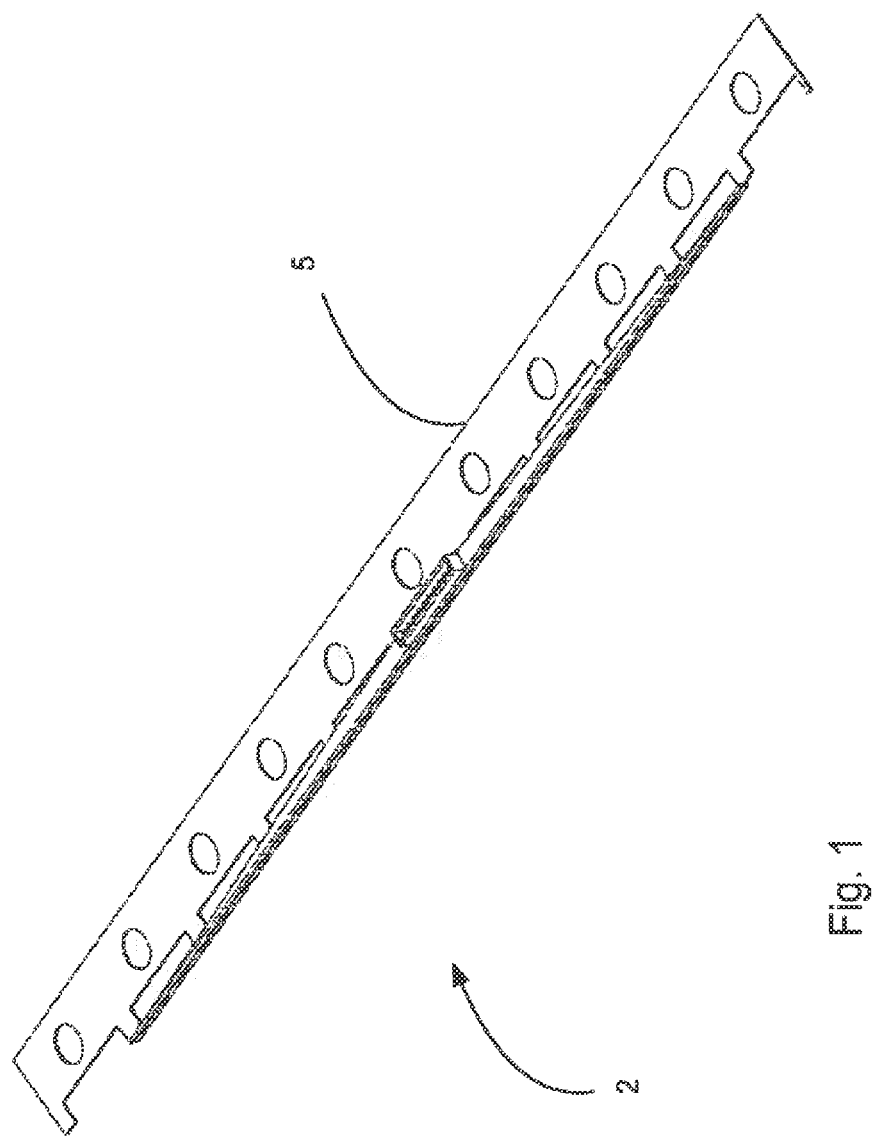
FIG. 1 illustrates a perspective view of an embodiment of an LED assembly.
Figure 2:
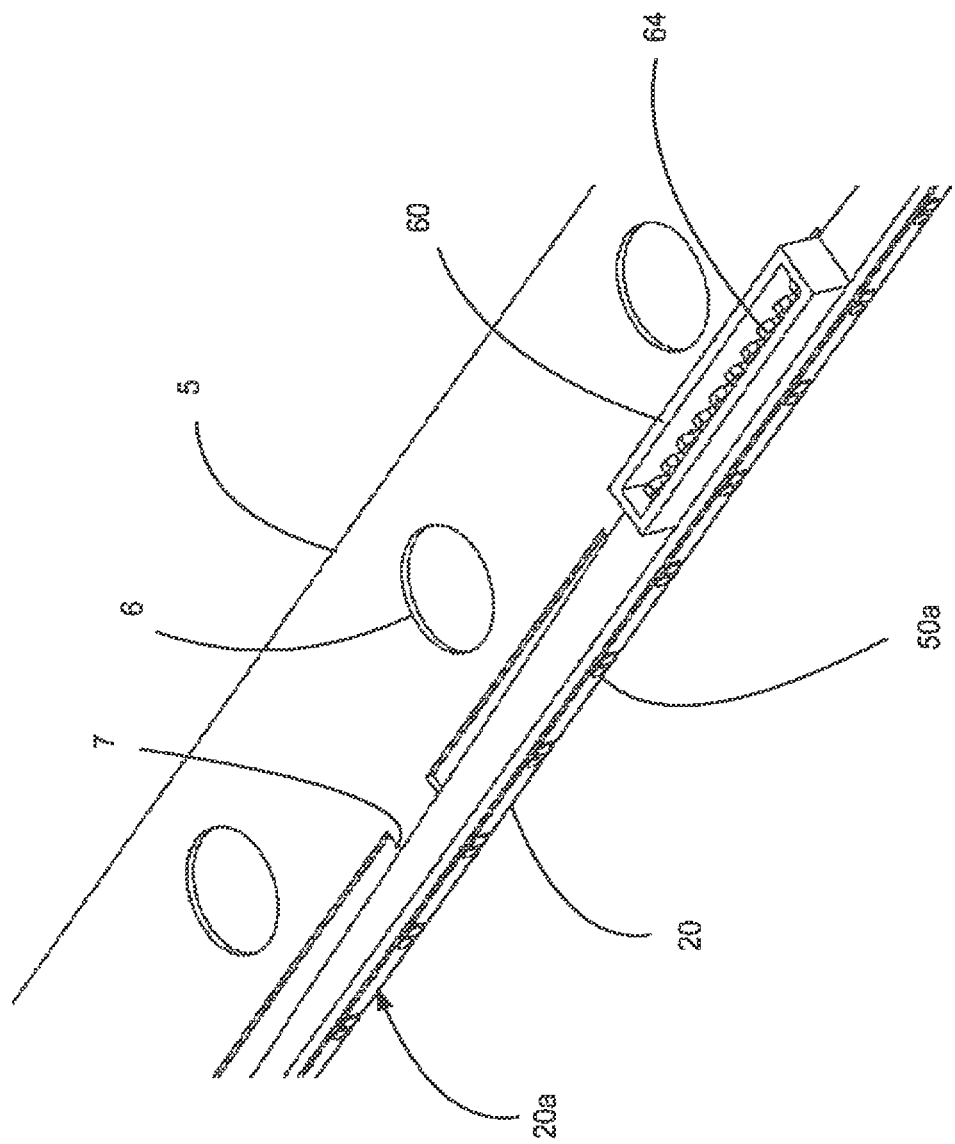
FIG. 2 illustrates an enlarged perspective view of the embodiment depicted in FIG. 1.
Figure 3:
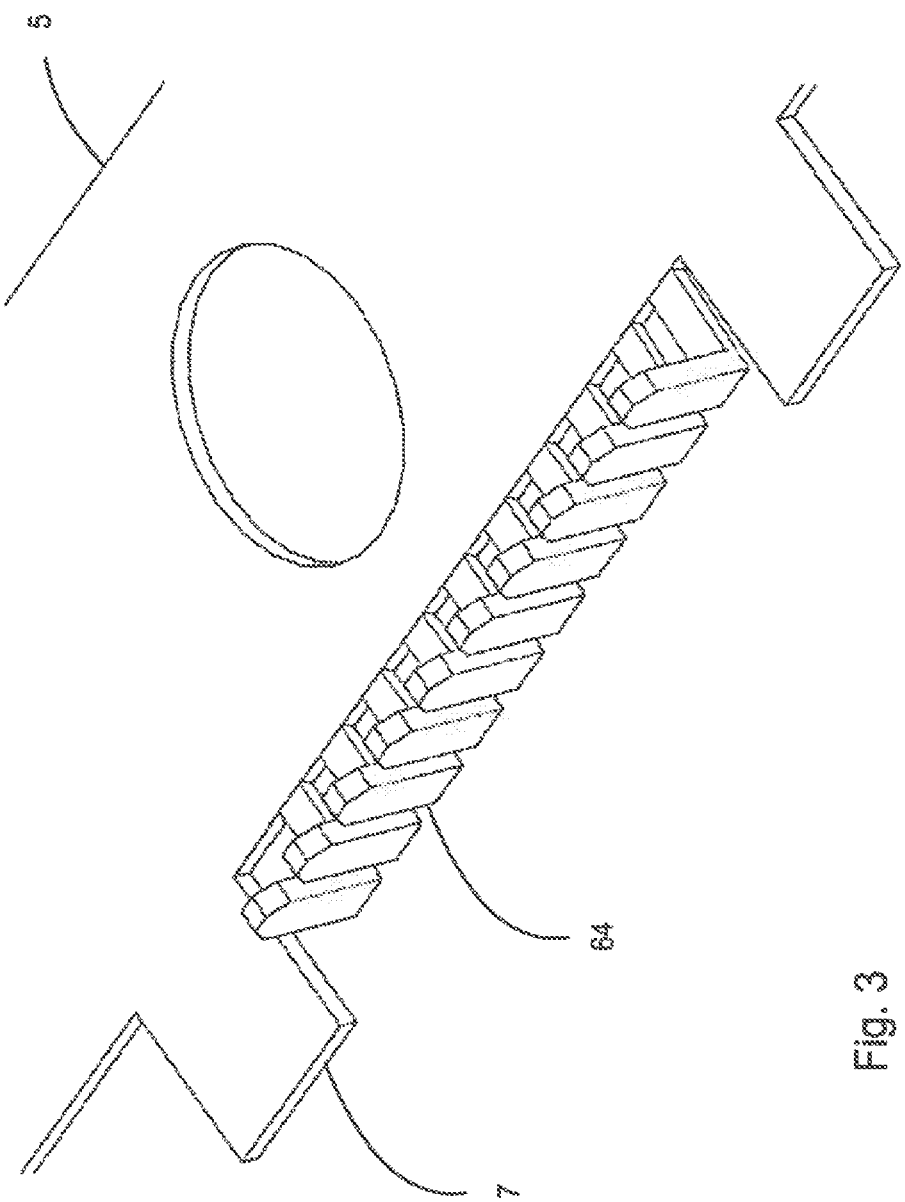
FIG. 3 illustrates a simplified perspective view of the embodiment depicted in FIG. 2.
Figure 17:
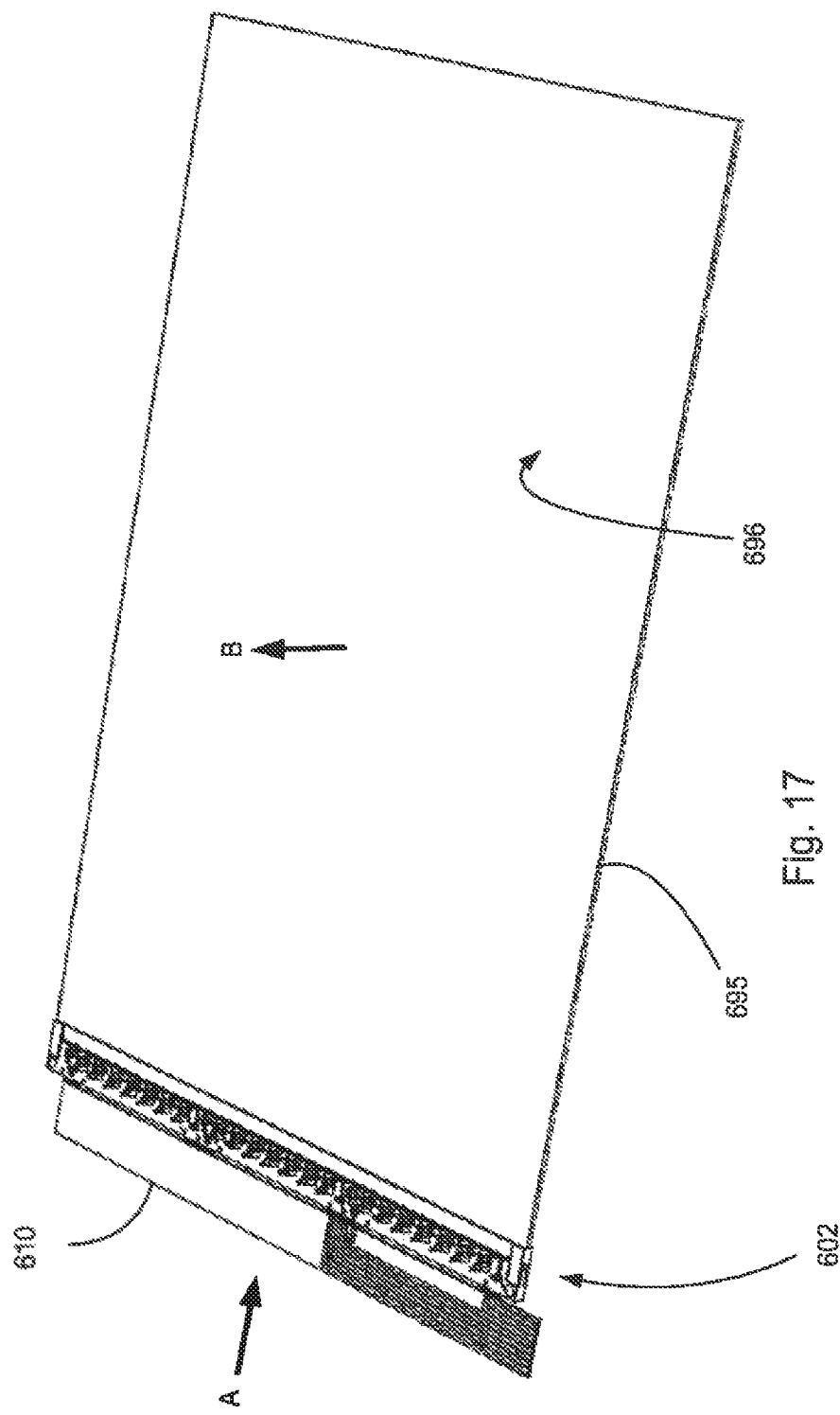
FIG. 17 illustrates a perspective view of an embodiment of an LED assembly with a light guide.
Figure 18:
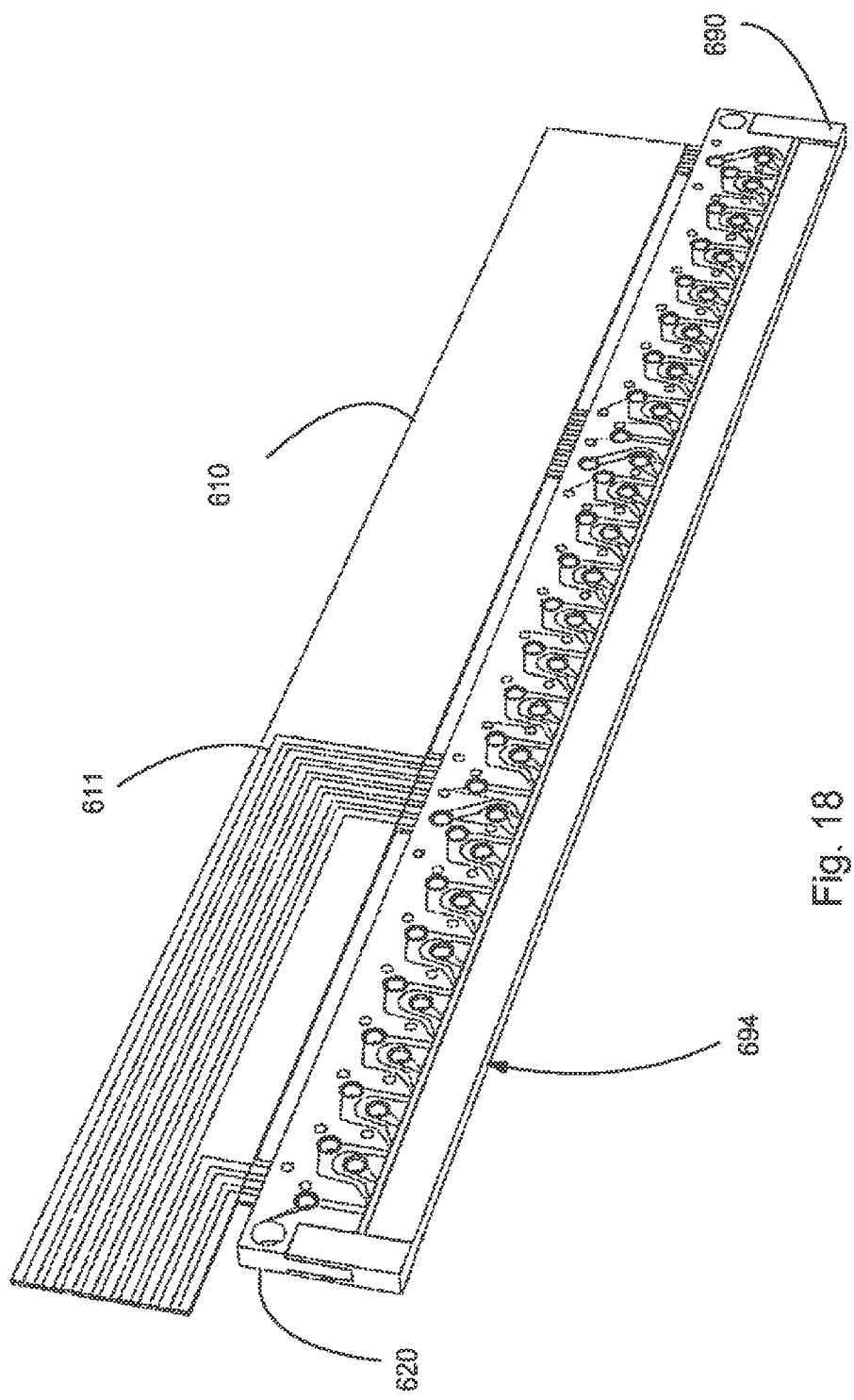
FIG. 18 illustrates a perspective view of the LED assembly depicted in FIG. 17.
Figure 19:
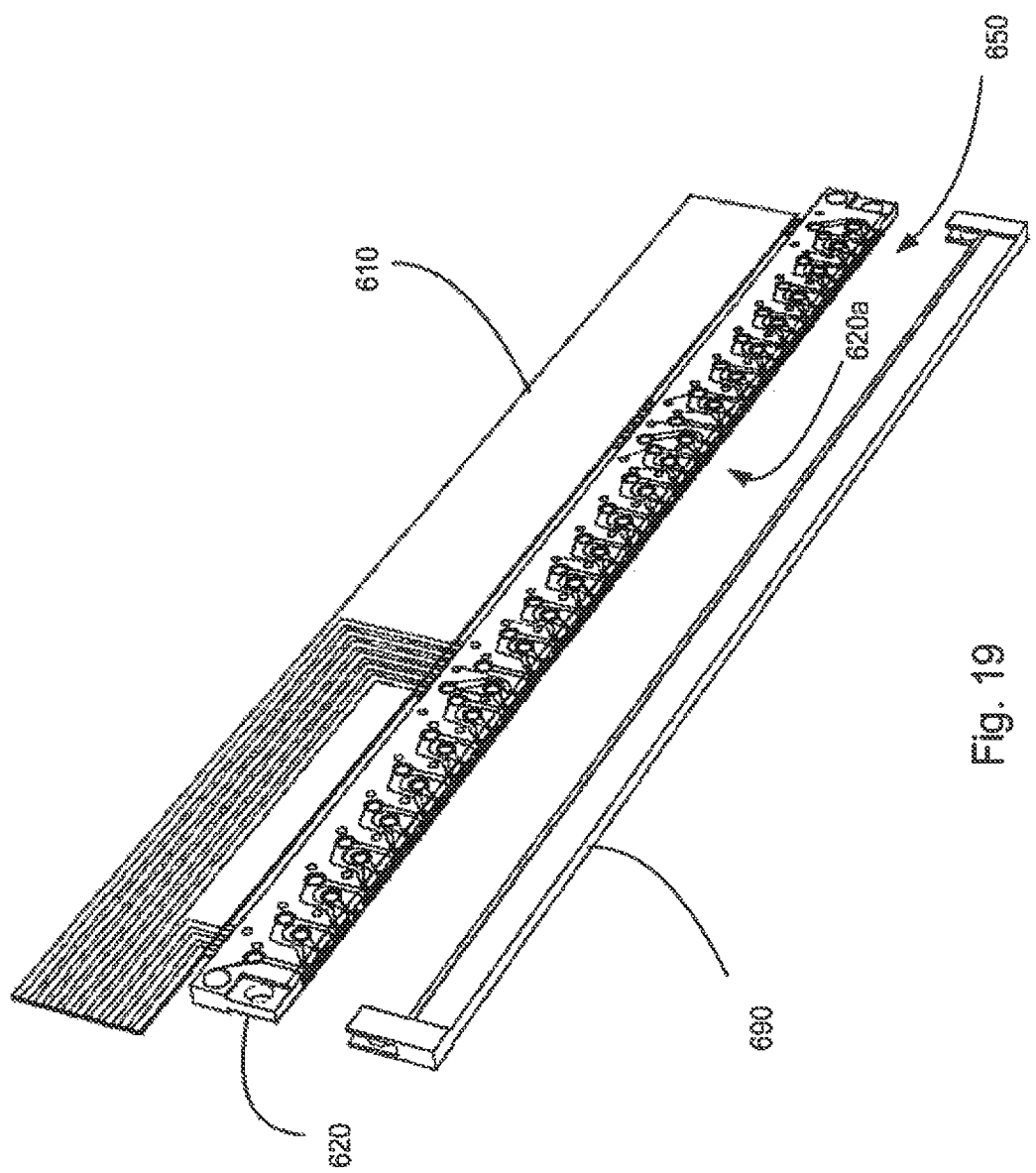
FIG. 19 illustrates a partially exploded perspective view of the LED assembly depicted in FIG. 18.
Figure 20:
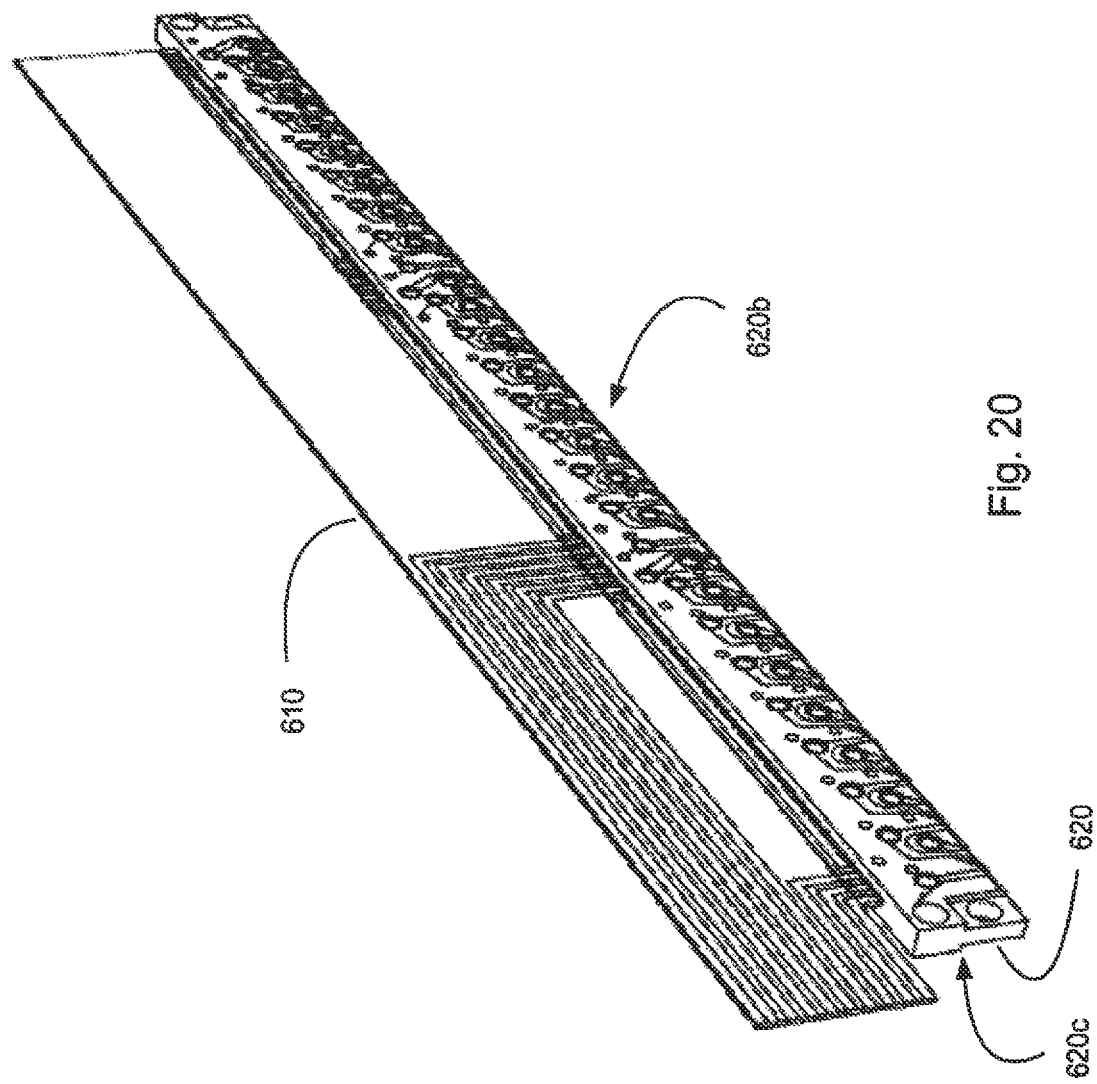
FIG. 20 illustrates a perspective view of the LED assembly depicted in FIG. 18.
Figure 21:
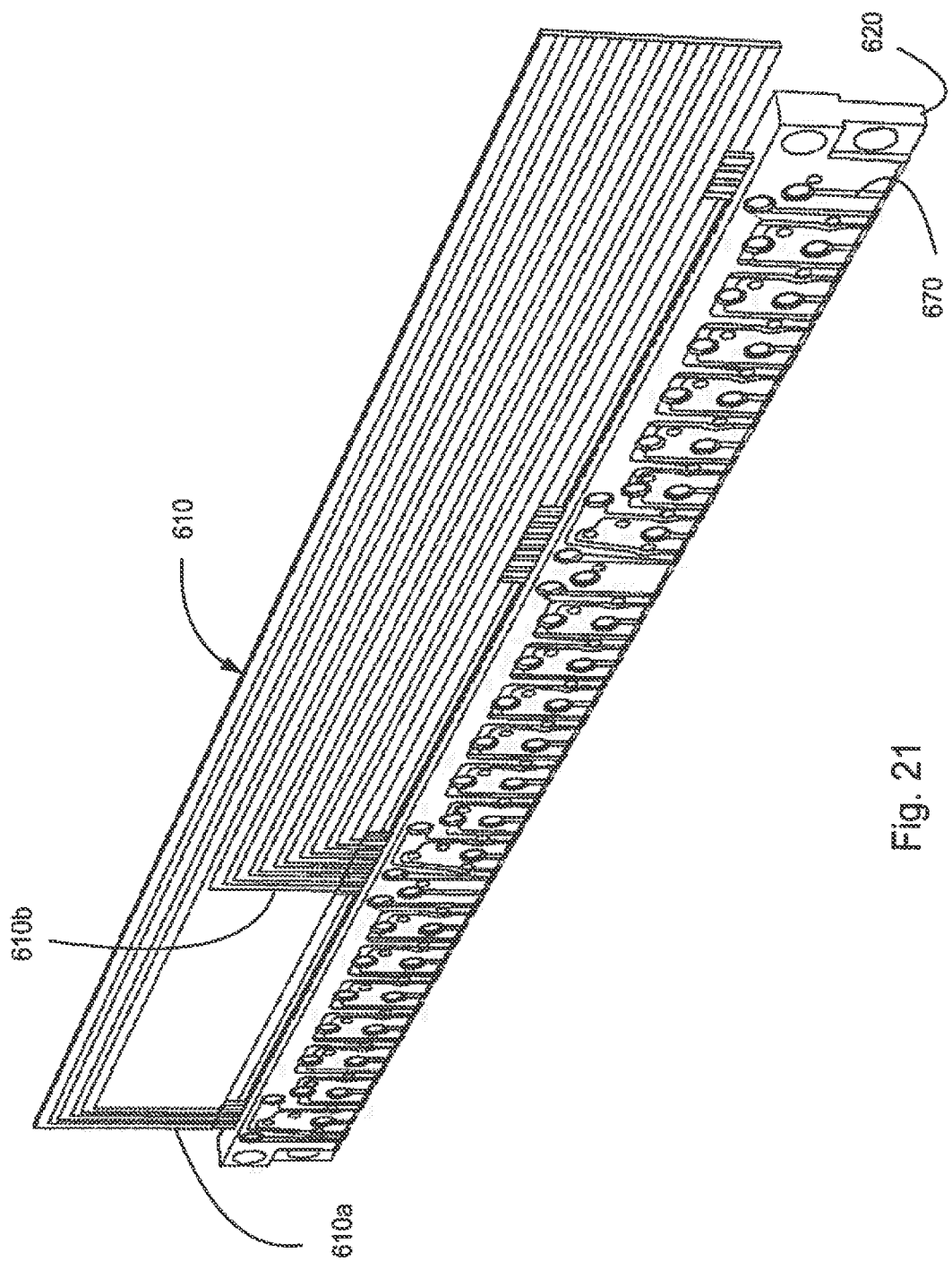
FIG. 21 illustrates another perspective view of the LED assembly depicted in FIG. 18.
Figure 22:
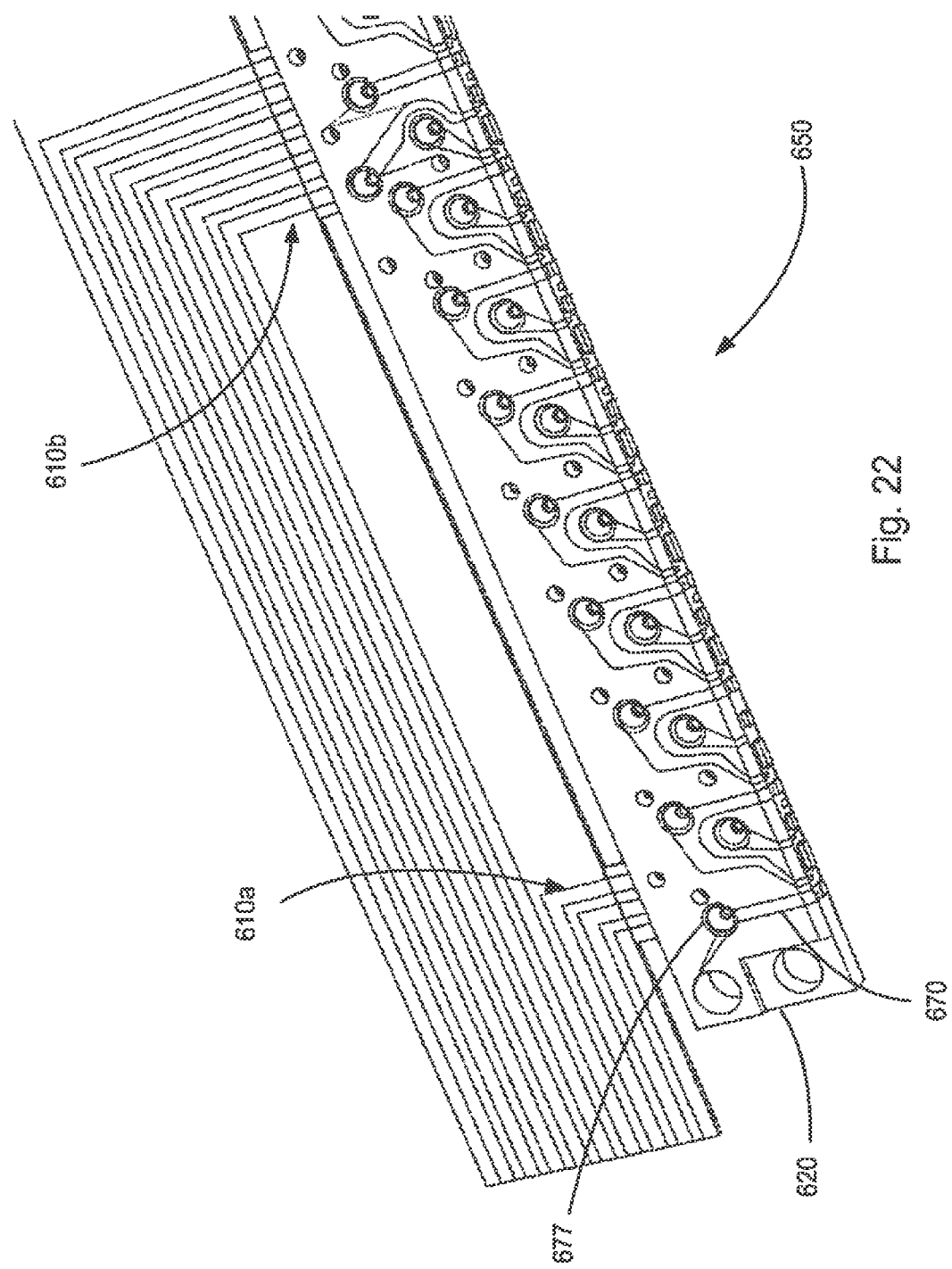
FIG. 22 illustrates an enlarged perspective view of the LED assembly depicted in FIG. 21.
Figure 23:
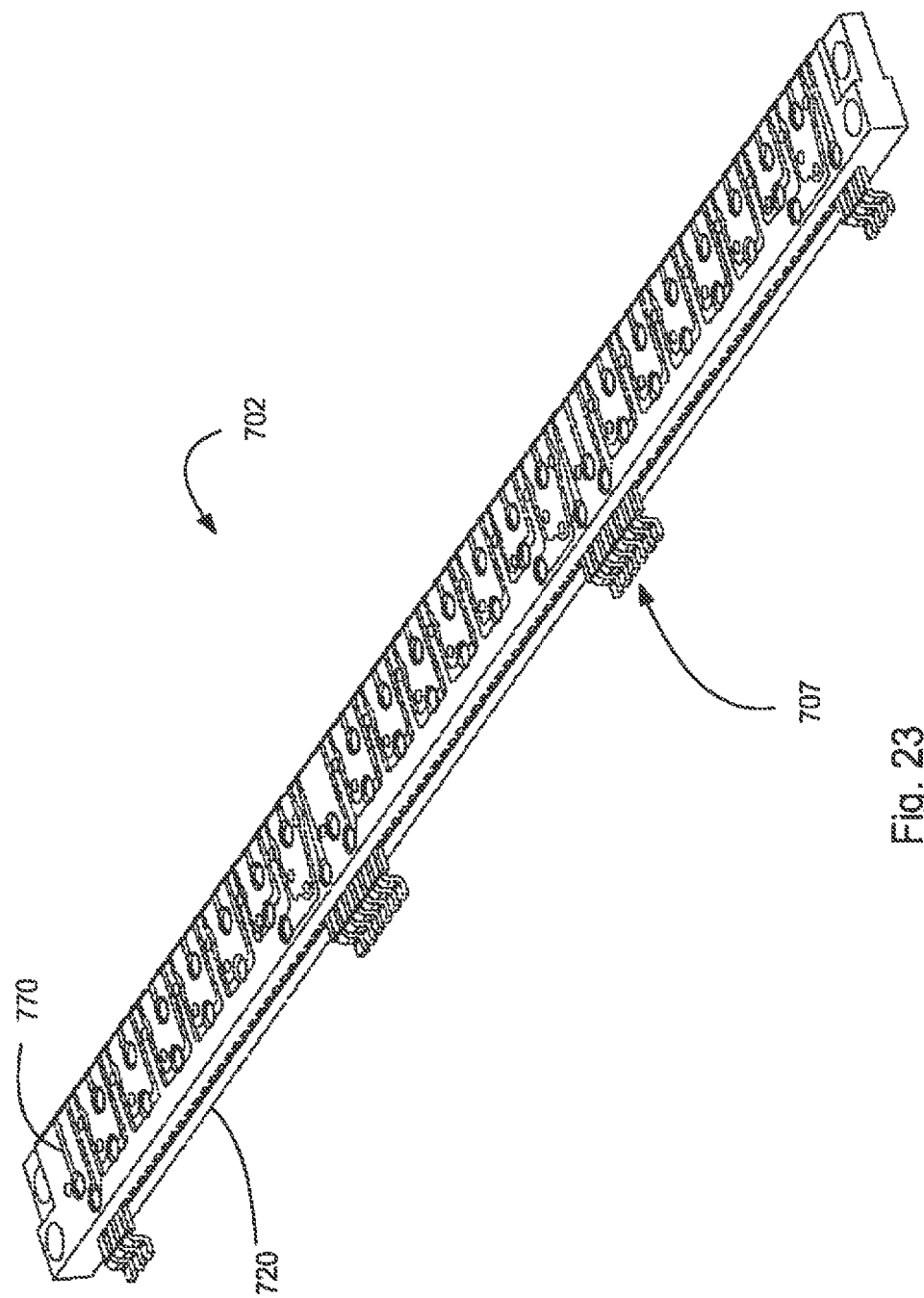
FIG. 23 illustrates a perspective view of another embodiment of LED assembly.
Figure 24:
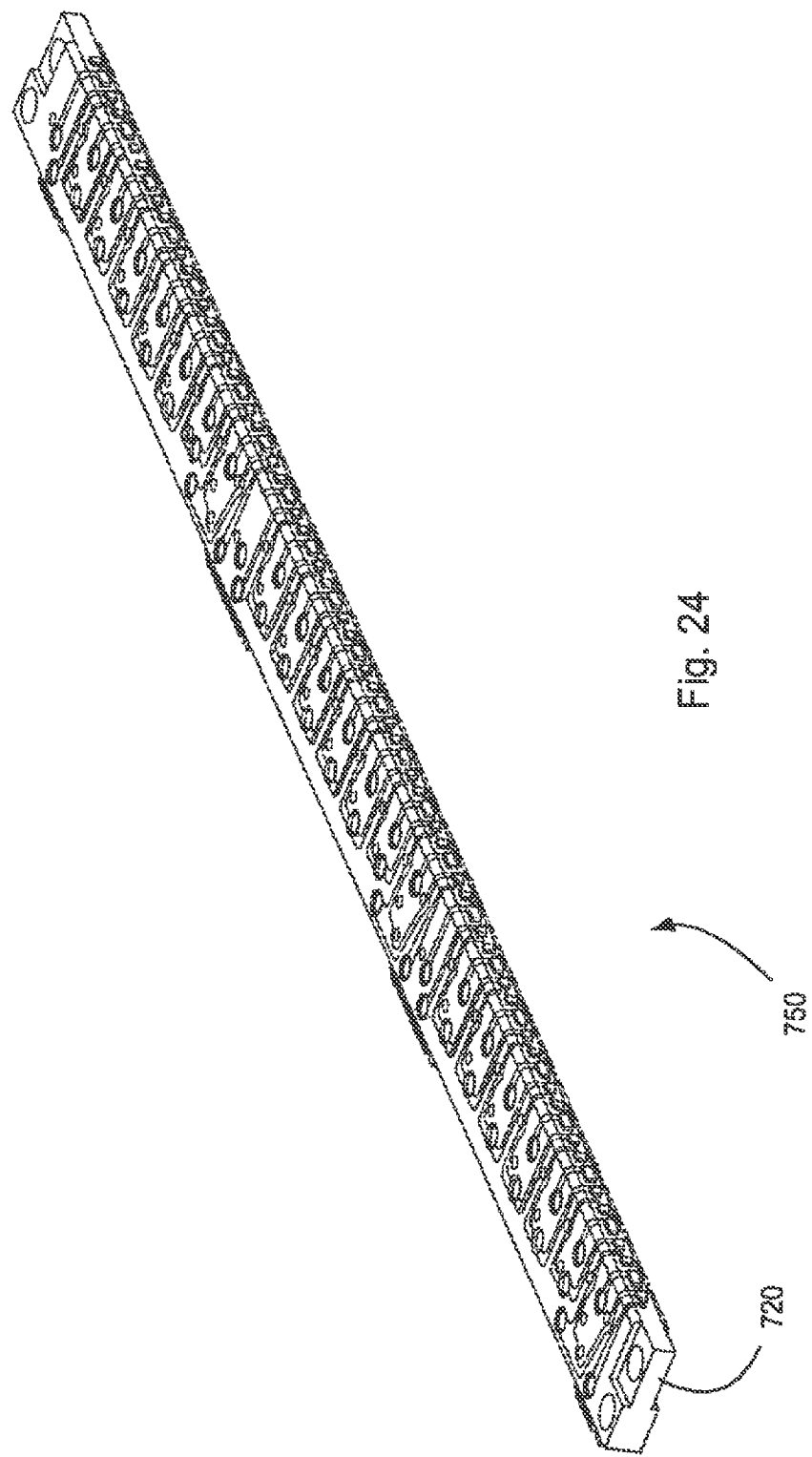
FIG. 24 illustrates another perspective view of the embodiment depicted in FIG. 23.

FIGS. 1-3 illustrate features of an exemplary embodiment of a LED assembly 2 that may be coupled to a light guide so as to provide a light panel. The light guide can be a convention construction such as a silicone-based material that is configured to direct light provided on the edges toward a face in a relatively even and consistent manner (e.g., can be a printed, etched, V-groove or microlens constructions). The LED assembly 2 would thus be mounted against a side of the light guide and be configured to direct light in to an edge of the light guide in a first direction A while light would emit from the light guide in a second direction B (such as is depicted in FIG. 17). As can be appreciated, different levels of assemblies are possible. A simple configuration could have LEDs positioned along only one edge of a light guide. Alternatively, LEDs could be positioned on two or more sides. Naturally, increasing the number of LED assemblies would increase costs but should not have a significant impact on efficiency as each of the LED assemblies could output less light and thus could be driven at lower power levels. Thus, for some designs it may be more desirable to have LED assemblies on two sides or four sides of the light guide (particularly if local dimming is desirable). As the design and construction of light panels with light guides is known, additional discussions regarding the resultant light panels is not included herein.

The depicted LED assembly 2 includes a strip 5 that can be formed of a standard metal alloy (such as a copper-based alloy). A dielectric frame 20 is provided on the strip. The frame can be less than 1 mm thick while having a length of more than 50 mm. It is expected that the frame will have a length to thickness ratio of greater than 20 to 1 and more likely will be greater than 50 to 1. The frame 20 includes a mounting side 20a. In an embodiment, traces are placed on the dielectric frame with a laser direct structuring (LDS) process and electroless plating. The traces can all be electrically connected to the strip 5, either by terminals 64 or by fingers 7, so that an electrical potential can be applied to all the traces and they can then be electroplated. Thus, the depicted embodiments can include electroplated traces rather than just electroless plated traces. One benefit of this is that it is possible to provide traces that can carry more current for a given width using electroplated traces because the thickness of the coating can be readily increased.

The frame 20 includes an integral connector 60 with the terminals 64, the terminals 64 being insert-molded into the frame 20. In operation, the traces can be arranged so that they are connected to the terminals 64 in the desired pattern. As can be appreciated, depending on the size of the frame there will only be a limited amount of area to route traces. Therefore, for increased granularity of control (e.g., if it is desirable to selectively turn off or dim certain LEDS) it may be desirable to have more than one connector and associated terminals.

Figure 4:
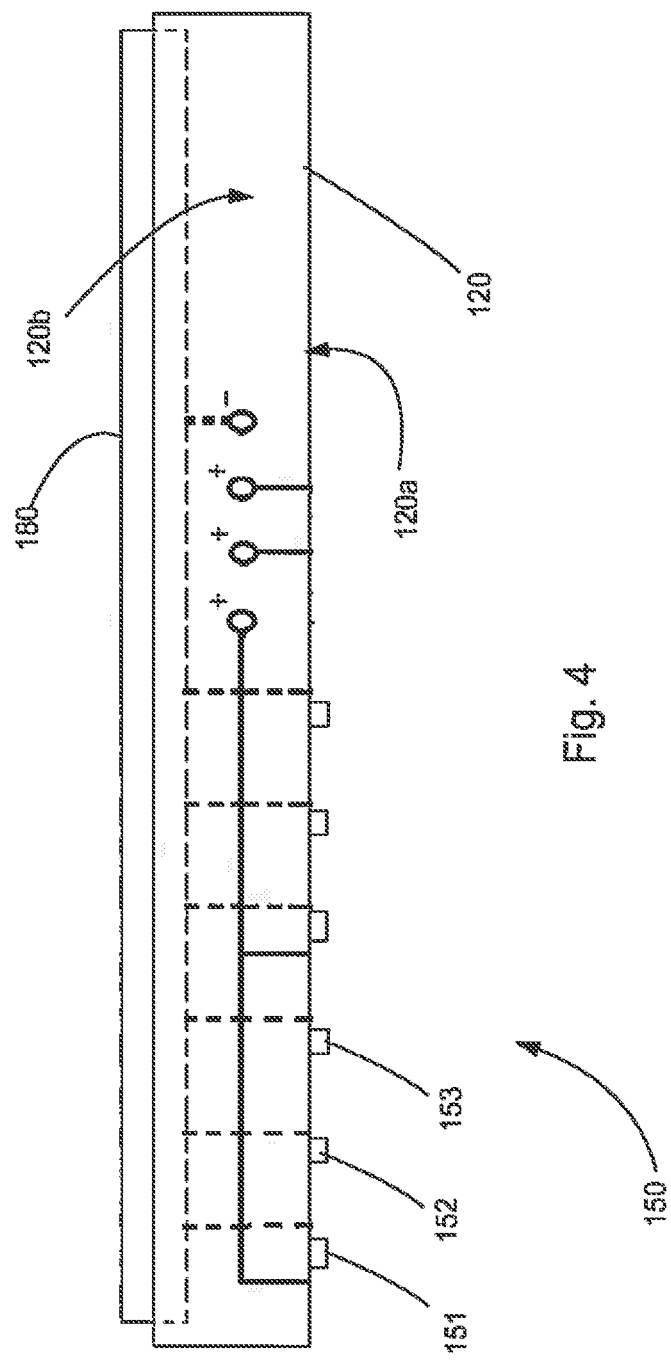
FIG. 4 illustrates a schematic diagram of an embodiment of an LED assembly.

Once the traces are formed, LEDs are placed on the mounting side of the frame 20 and connected to the appropriate traces to form the desired electrical circuit. Exemplary embodiments of potential circuit designs are depicted schematically in FIGS. 4-6. As can be appreciated, FIG. 4 illustrates schematically that LEDs 151, 152, 153 mounted on the mounting side 120a of frame 120 and the frame 120 includes certain traces that are also positioned on top surface 120b. A bar 180 connects the various cathodes together. Thus FIG. 4 illustrates the use of a common negative trace and just uses separate anodes for each LED. Naturally, an anode can be shared with a group of LEDs of a particular color or location.

Figure 5:
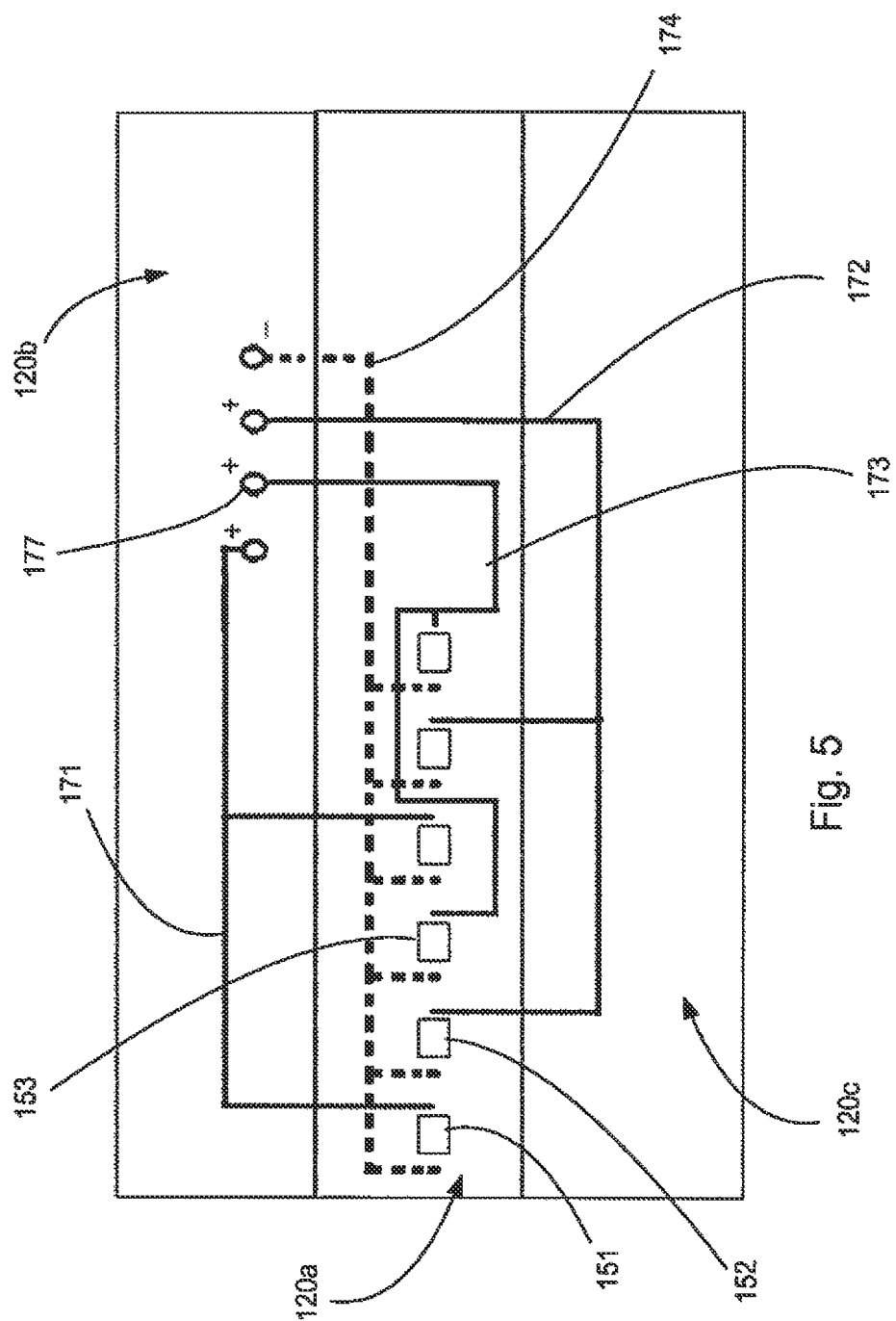
FIG. 5 illustrates another schematic diagram of an embodiment of an LED assembly.
Figure 6:
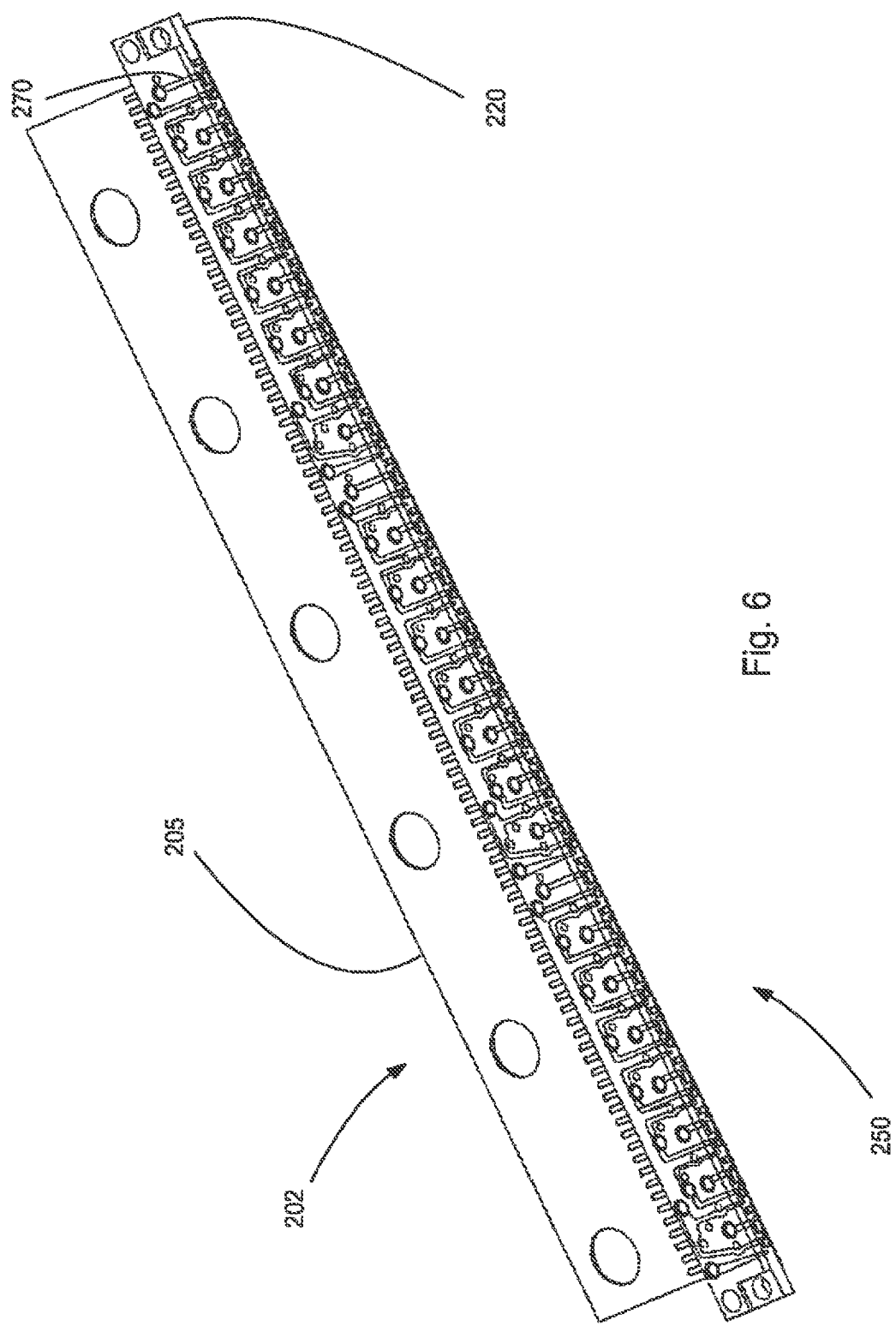
FIG. 6 illustrates a perspective view of an embodiment of an LED assembly.
Figure 8B:
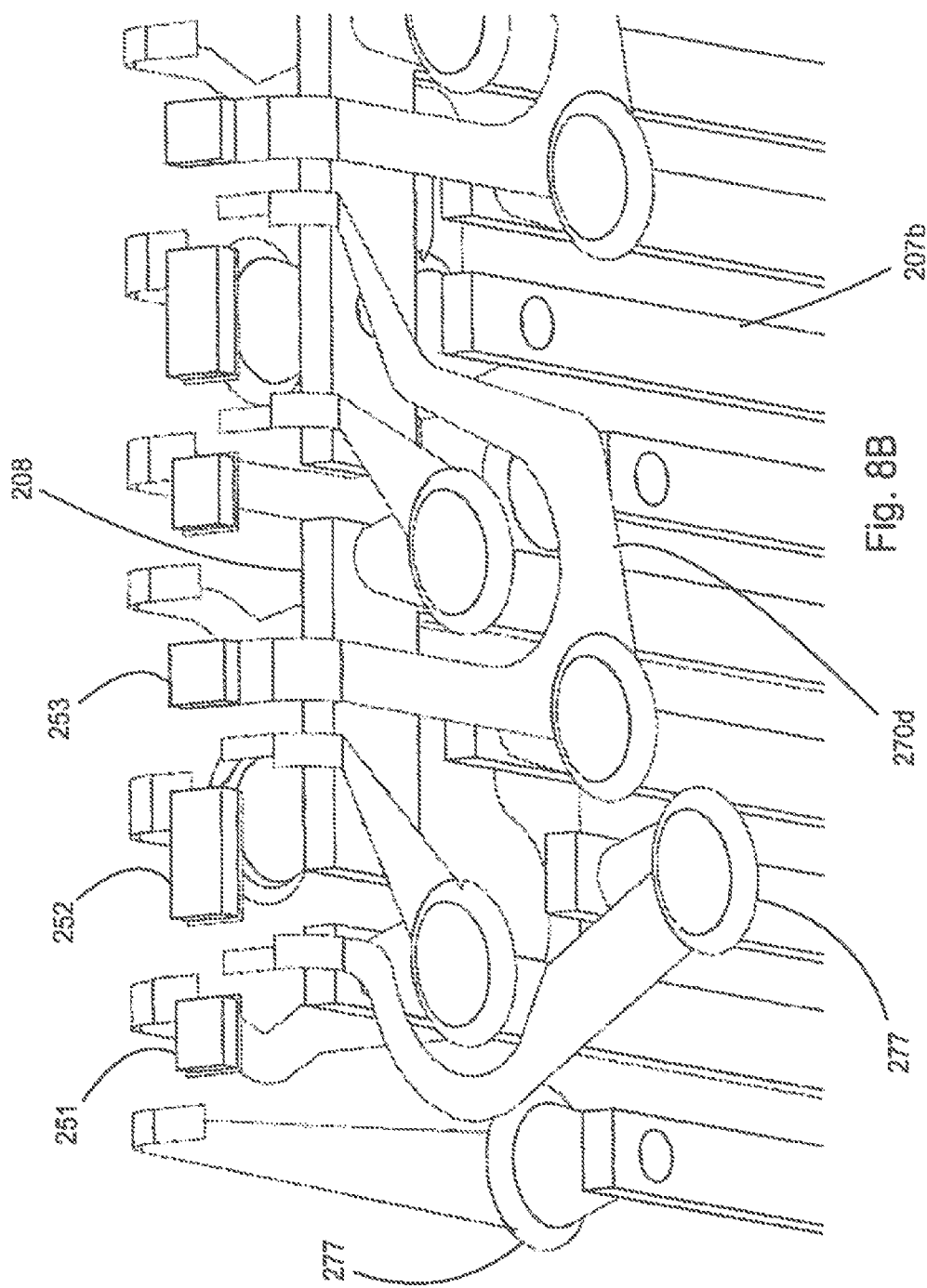
FIG. 8B illustrates another simplified perspective view of the embodiment depicted in FIG. 6.

FIG. 5 illustrates a schematic representation of three sides of frame (a mounting side 120a, a top side 120b and a bottom side 120c). As depicted, LEDs 151, 152, 153 are mounted on the mounting side 120a. Traces 171, 172 and 173 are provided on the mount surface 120a and one of either the top side 120b or the bottom side 120c and serve, in connection with common trace 174, to power the LEDs. As can be appreciated, each of the traces 171, 172, 173 are configured to actuate two LEDs. If the LEDs are arranged to provide an RGB output then LED 151 could be red, LED 152 could be green and LED 153 could be blue. The depicted embodiment thus allows the red, green and blue level to be separately controlled for two sets of LEDs (a set could include one red, one green and one blue LED), however, it is not possible with this configuration to separately control the red, green and blue output for each set of LEDs as the red, green and blue LEDs of the two sets of LEDs are connected in parallel.

As can be appreciated, the actual circuit design will vary depending on the number of LEDs, whether there are multiple colors of LEDs, whether one or more of the LEDs need to be connected in series, and the granularity of control over the LEDs that is desired. The connection between the LEDs and the traces can be provided via conventional wire bonds. As noted above, the traces can be connected to terminals that are formed into a connector that is integral with the frame and if additional granularity is desired then additional terminals can be used.

It should be noted that while the use of three separate colors are discussed (e.g., the depicted design is suitable for a typical RGB solution), solutions with additional LED colors are also contemplated. As can be appreciated, having a good red, green and blue LED is sufficient to provide a white light but depending on the performance of the different colors of LEDs it may be desirable to have one or more additional colors incorporated into the solution. In addition, if the LEDs are configured to provide white light (e.g., blue pumps configured to activate a phosphor coating, for example, or include die that can produce multiple wavelengths of light) then only one type of LED color (white) would be needed and a simpler circuit couple be used. If local dimming is desirable, however, then even with the use of white light producing LEDs it may be desirable to have regions of LEDs separately controllable. Thus, the depicted circuit configurations are not intended to be limiting.

FIGS. 6-8B illustrate another embodiment of an LED assembly 202 is disclosed. A frame 220 includes an LED array 250 connected to traces 270 that are originally connected to strip 205 so that the traces 270 can be electroplated as discussed above. It should be noted that once the traces are fully plated the strip 205 can be removed and the internal structure of terminals and the pattern of traces can be used to provide the desired electrical circuit.

FIG. 7 illustrates an enlarged view of the frame 220, which includes a mounting side 220*a*, a top side 220*b* and a bottom side 220*c*. Traces 270 include trace 270*a*, 270*b*, 270*c* and 270*d*. As can be appreciated, each trace extends along two sides (e.g., trace 270*a* extends along mounting side 220*a* and 220*b*). The traces 270 are connected to terminals by vias 277. The traces 270 are configured to provide power to LEDs 251, 252, 253, which are arranged as a red, green and blue LEDs. It should be noted that while each is depicted as a different size, that size different is mainly for purposes of illustration. The LEDs could be different sizes or all the same size, depending on the efficacy of each LED and the desired amount of power provided to each LED. A strip 205 with apertures 206 is used to support the frame during the construction process and allows for the electroplating discussed above.

Figure 9:
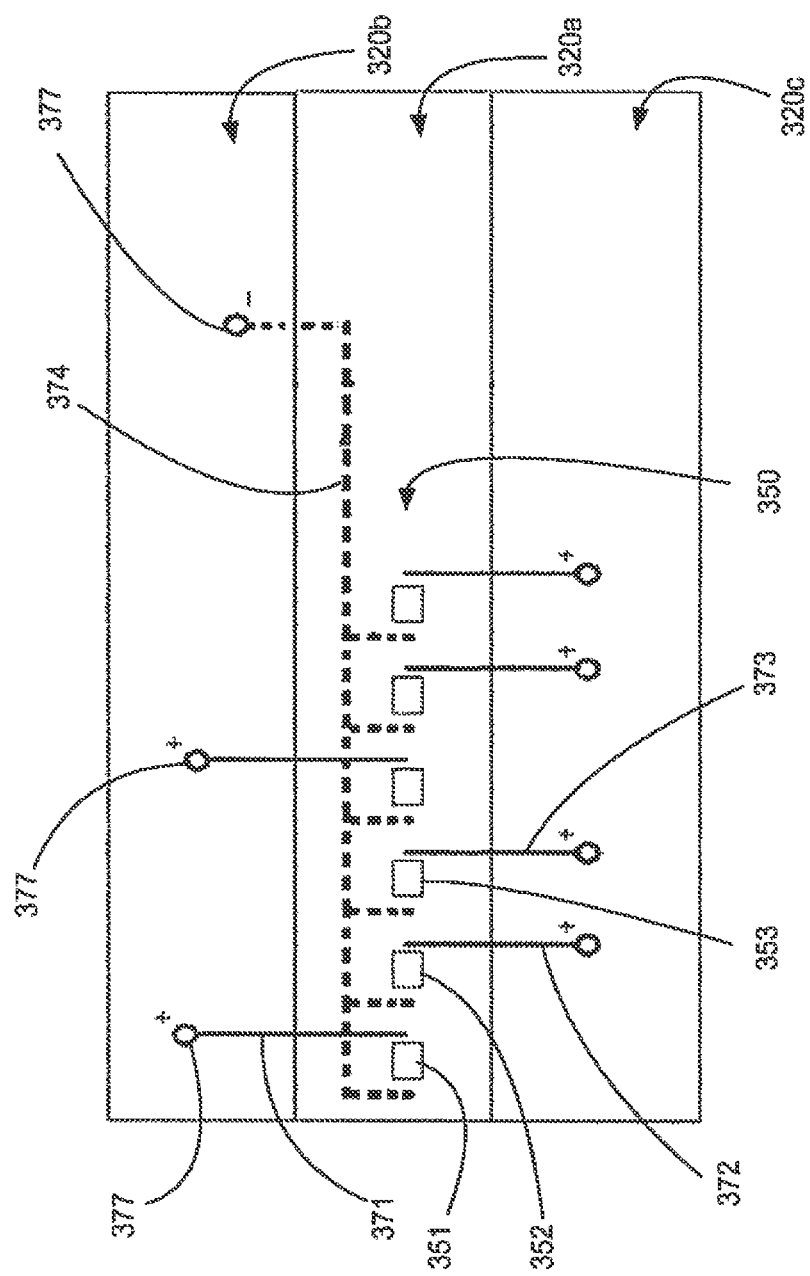
FIG. 9 illustrates a schematic diagram of an embodiment of an LED assembly.
Figure 12:
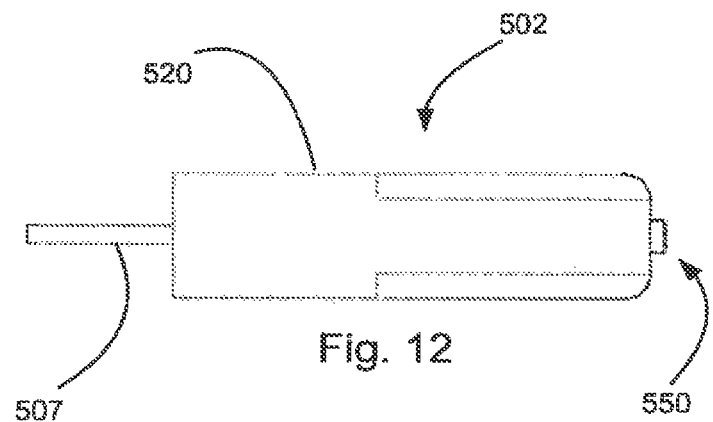
FIG. 12 illustrates an elevated side view of an embodiment of an LED assembly.
Figure 13:
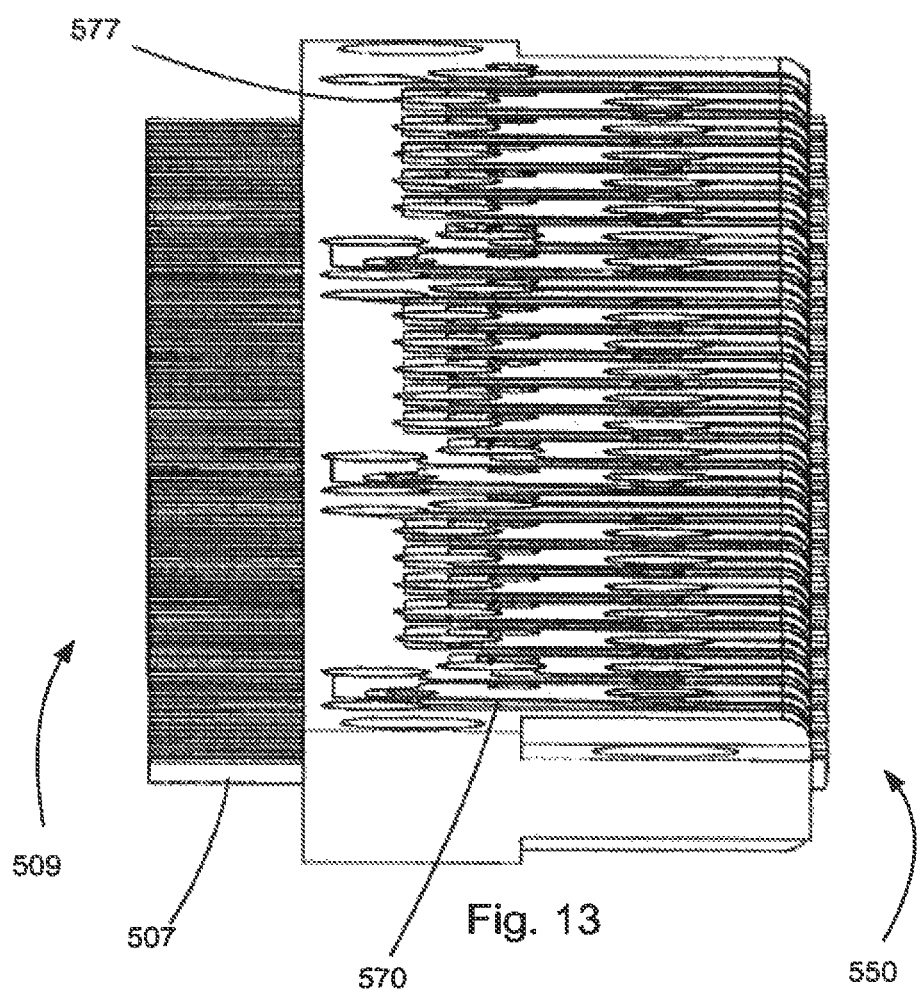
FIG. 13 illustrates a perspective view of the LED assembly depicted in FIG. 12.
Figure 14:
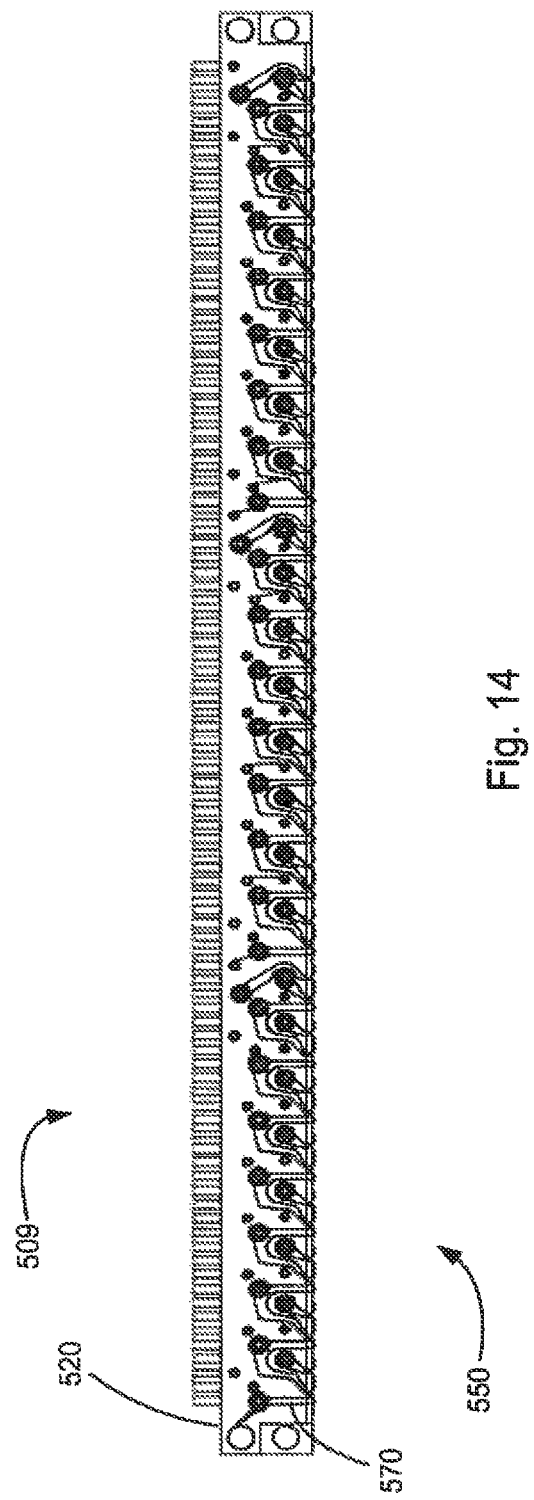
FIG. 14 illustrates a plan view of the LED assembly depicted in FIG. 12.
Figure 15:
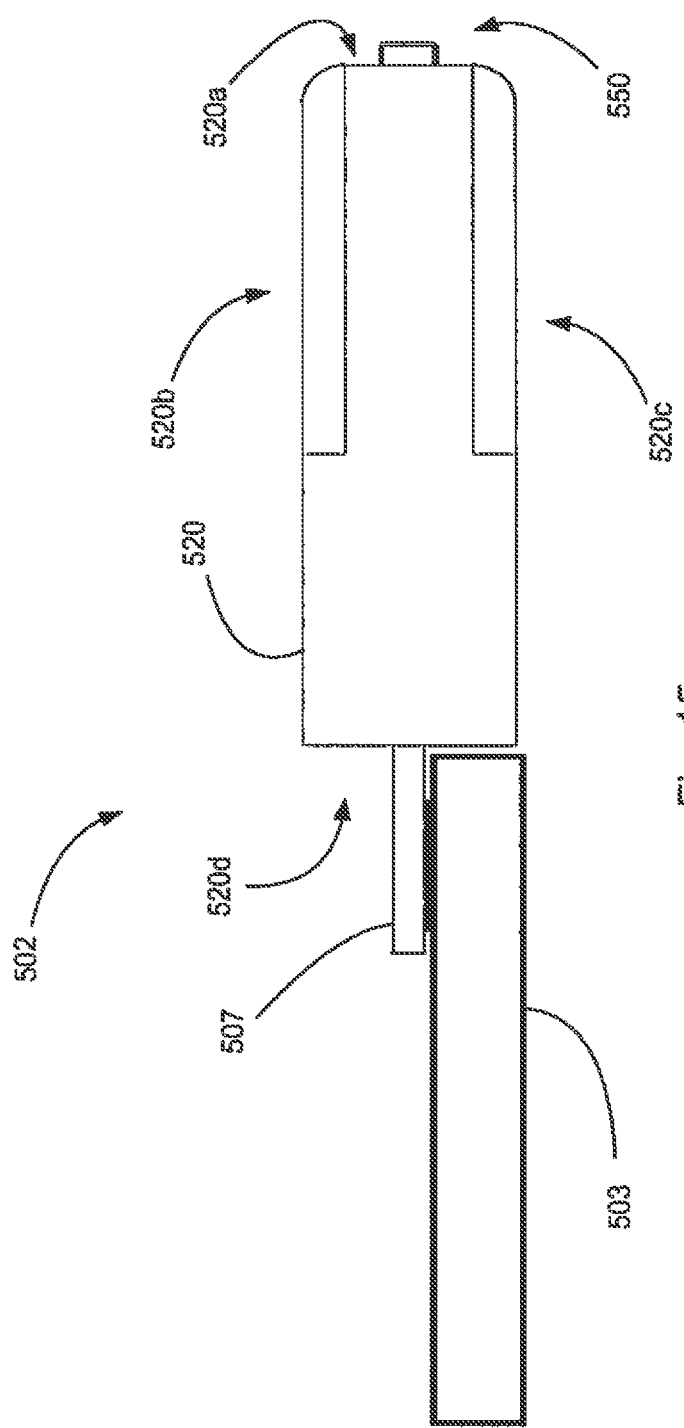
FIG. 15 illustrates an elevated side view of an embodiment of an LED assembly mounted on a circuit board.
Figure 16:
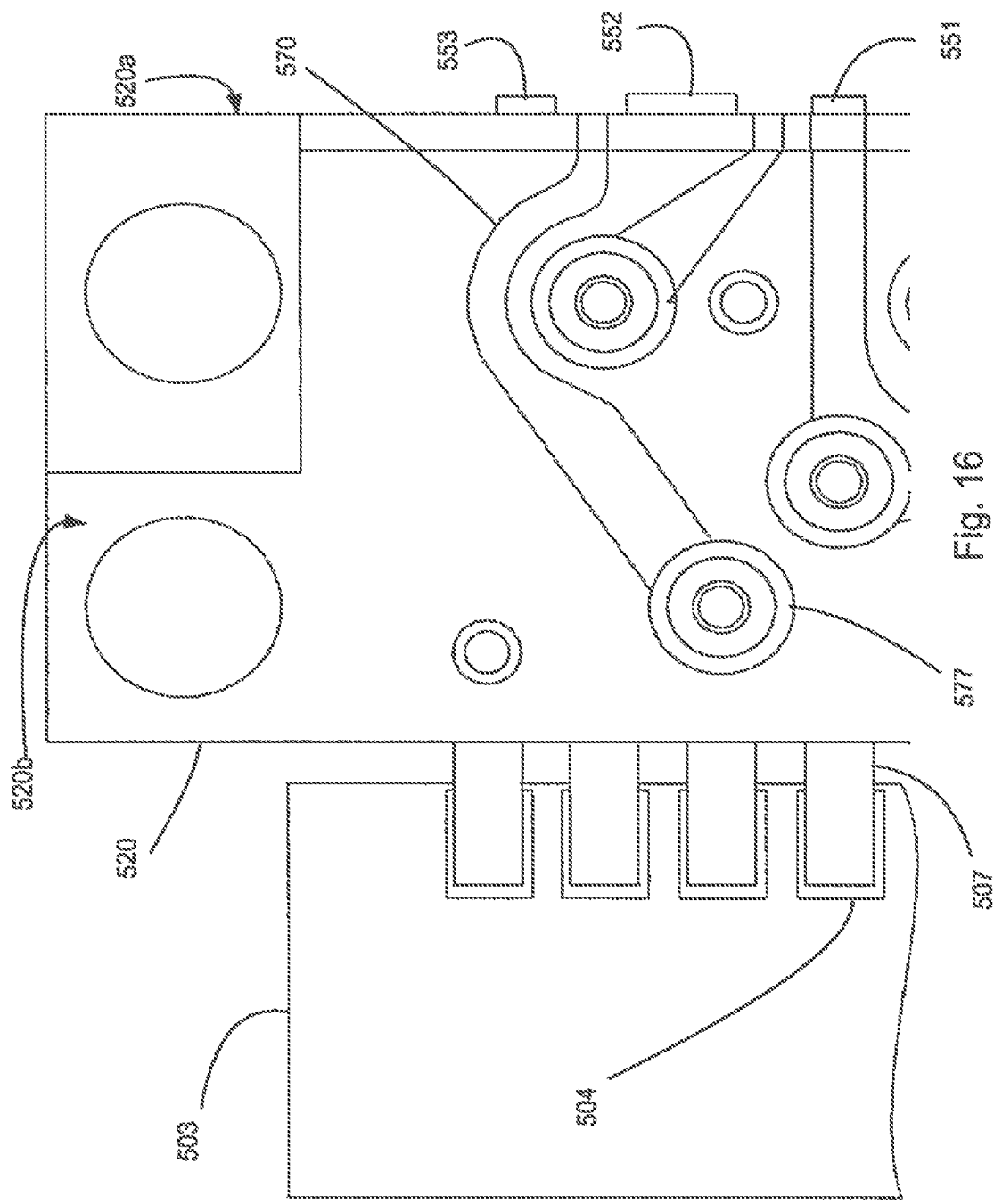
FIG. 16 illustrates an enlarged plan view of the embodiment depicted in FIG. 15.

As can be appreciated from FIGS. 8-9B, terminals 207*a*, 207*b*, 207*c* extend from strip 205 and are connected to the traces by the vias 277. Once electroplated, the strip 205 can be removed so that the terminals 207 can be isolated and the traces 270 and terminals 207 can be used together to provide the desired electrical pattern. The LEDs 251, 252, 253 can be secured to the frame 220 and/or to the traces 270 and can electrically connected to the traces 270 with conventional wire bonding techniques. It should be noted certain traces can be electrically connected to other traces by having both traces electrically connected to the same terminal. In addition, a single trace, such as trace 270*b*, can be electrically connected to multiple LEDs. Thus, as can be appreciated, relatively complex structures are possible and the configuration can provide a three-dimensional circuit. The actual structure will depend on the desired circuit.

FIGS. 9-11 provide three schematics of potential diagrams that could be used. In FIG. 9, a mounting side 320*a*, a top side 320*b* and a bottom side 320*c* are depicted. LEDs 351, 352 and 353 are provided and each of these LEDs is a different color. Trace 371 connects LED 351 to a via 377 on the top side while traces 372, 373 connect LEDs 352, 353 to vias on the bottom side 320*c*. A common trace 374 (which can extend along a back of a frame or be provided internally in the frame) connects all the LEDs to via 377, thus there is a common cathode while the anodes are each separate.

FIGS. 10 and 11 illustrate variations of the embodiment depicted in FIG. 9. Both illustrate a schematic representation with a mounting side 420*a*, a top side 420*b* and a bottom side 420*c*. Both have the same LED 451 used multiple times (thus LED 451 is an example of a white light LED). The difference is that while both have vias 477*a*, 477*b*, 477*c*, 477*d* connected as the anode for different LEDs 451, the cathode via 477*e* is shared in FIG. 10 while there are separate cathode vias 477*e* associated with each LED 451 in FIG. 11. Thus, the same LED array 450 can be powered by different configurations of traces.

FIGS. 12-16 illustrate an embodiment that can advantage of separate traces for each LED. An LED assembly 502 includes a carrier 520 and terminals 507 insert molded into the carrier while an LED array 550 is provided on a mounting side 520*a* and the LED array 550 includes sets of LEDs 551, 552, 553 that can each be configured to provide a different color (e.g., red, green, blue) as previously discussed. Traces 570, which can be configured in complex shapes as discussed above with respect to FIGS. 6-8B, are provided on a tope side 520*b* and a bottom side b20*c* of the carrier 520. The terminals 507, which can be configured similarly with different lengths and shapes like what was depicted in FIGS. 6-8B, can be connected to the traces 570 with vias 577 and extend out a back side 520*d* of the carrier 520 and can be configured to be soldered directly onto pads 504 on a PCB 503. As can be appreciated, such a construction avoids the need for distinct connectors to a PCB 503, which generally is needed to support a controller and other driver components. In addition, the ability to have a substantial portion of the PCB positioned within the frame of the carrier allows for a very low profile system where the entire solution is less than three times the thickness of the PCB. Furthermore, it is possible to control the LEDs with a very high degree of granularity. Thus, a number of benefits can be realized by such a construction.

FIGS. 17-22 illustrate an embodiment of an LED assembly 602 that includes a flex member 610 and the LED assembly 602 is coupled to a light guide 695. In general, light guides are planar and are typically configured so that light is emitted from the surface of the light guide in a substantially uniform nature. Thus, in general, light is directed into an edge of the light guide by an LED assembly (e.g., in an A direction) and then is directed out of a planar surface (e.g., in a B direction) by the light guide. As depicted, for example, light is directed from the LED assembly 602 by a light ramp 690, which includes a mating surface 694 that presses against the light guide and light emits from planar surface 696 of the light guide 695 due to internal features of the light guide (not shown).

As can be appreciated, providing a light ramp that directs light from the LED array on the frame to the light guide can help improve performance of the overall system. Notably, if the light ramp has a mating surface that is configured to press against the light guide and that interface is compliant then it is possible to provide a better optical interface (e.g., an interface with less loss of light) between the LEDs and the light guide.

A light ramp 690 is shown separable from the frame 620 and in an embodiment the light ramp 690 could be formed separately and then pressed onto the frame. Alternatively, the light ramp 690 could be formed of a compliant silicon material that is molded over a mounting side 620*a* of the frame 620 and is configured to optically couple the LEDs to the light guide. The light ramp 690 preferable will be configured so as to provide internal reflections for the wave lengths being emitted from the LED array 650 wherever the light ramp 690 is not pressed up against the light guide 695.

The frame 620 includes top side 620*b* and bottom side 620*c* and traces 670 and vias 677 can be provided on the frame 620 in manner similar to the embodiments discussed above so as to provide the desired electrical pattern. One difference is that a flex member 610 is insert-molded into the frame instead of terminals. Traces 670 are thus connected to conductive lines 611 by the vias 677. Flex member 610 can be a multi-layer flex that includes multiple conductive lines 611 but unlike a PCB, the flex member 610 is flexible and thus can be bent or shaped into a desired orientation. As can be appreciated, for displays where it is desirable to have the visual screen extend to nearly the edge of the device, such a construction will allow the flex member 610 to be folded over and just the frame and light guide can be positioned outside of the actual display. Thus can allow for a relatively thin bezel (the frame and light ramp can be configured to be in the range of about 5 mm or less from the back of the frame to the front of the light ramp) around the display.

Figure 27A:
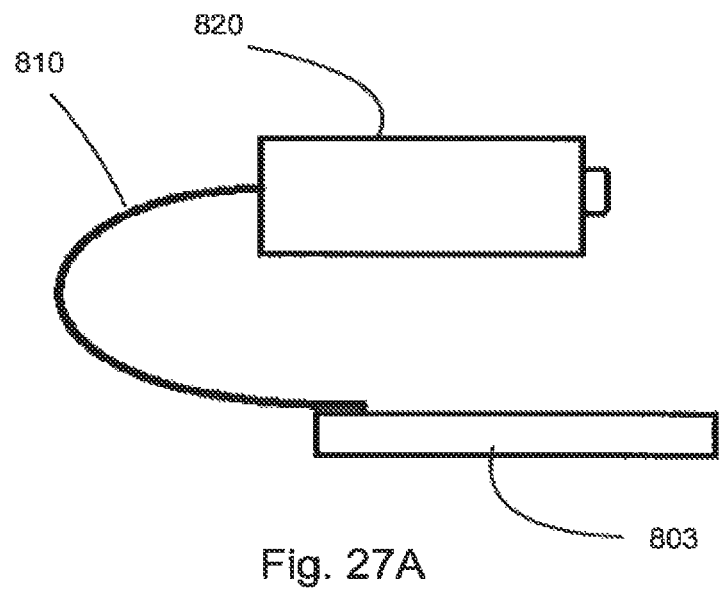
FIG. 27A illustrates a schematic representation of an embodiment of an LED assembly.
Figure 27B:
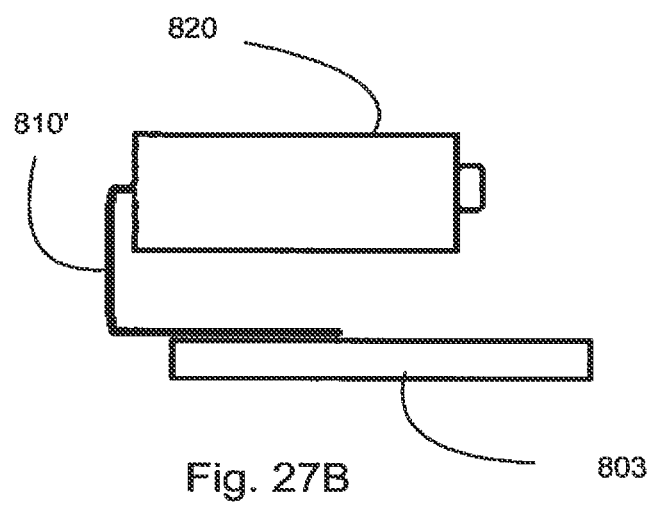
FIG. 27B illustrates another schematic representation of an embodiment of an LED assembly.

Thus, while the depicted embodiment of the flex member shows the conductive lines extend toward an edge (e.g., they make a 90 degree turn to one side), the conductive lines in the flex member could extend straight back and due to the ability to bend the flex member, the flex member could connect to a circuit board in a manner similar to that depicted in FIGS. 27A or 27B.

For example, a frame 820 could be coupled to a PCB 803 by a curved flex member 810 or by a flex member 810' that has sharper angles formed into it. As the use of flex members are well known, no further discussion regarding the design and construction of them is provided herein.

Unlike the configuration depicted in FIGS. 12-016, the conductive lines 611 can be provided in groups 610a, 610b that are configured to control sets of LEDs. Thus one conductive line (assuming the cathode was a shared line as discussed above) could power one, two or more LEDs at the same time and the LEDs being powered could each be in parallel or in series. For example, the embodiment depicted in FIGS. 17-22 is provided with enough conductors to control 8 sets of LEDs. As can be appreciated, a portion of the LED assembly with 8 sets of LEDs can be configured so as to have 24 LEDs spaced apart so that the sets of LEDs, where each set of LEDs includes one red, one green and one blue LED, are provided every 2.5 mm. If the colors are controlled separately, the controlling 8 sets of LEDs at the same time can provide granularity of about 20 mm (e.g., the amount of red, green and/or blue light being emitted could be controlled separately over a 20 mm distance). Thus, the granularity of control would be about 20 mm. Alternatively, if each set of LEDs was controlled separately then the granularity could be 2.5 mm. Depending on the configuration of the display and the desirability/use of local dimming the increased granularity may or may not be beneficial.

FIGS. 23-26 illustrate an embodiment of an LED assembly 702 that has a frame 720 that supports an LED array 750. The frame 720 supports sets of terminals 707 that are configured to be solder attached to a printed circuit board. The frame 720 includes traces 770 on top side 720b and bottom side 720c and includes vias 777 that connect the traces 770 to other traces or to internal conductors so as to allow for control of LEDs 751, 752, 753 (which are depicted as being arranged in sets of red, green and blue LEDs) that are provided on a mounting side 720a of the frame 720. As can be appreciated, the number of terminals is similar to the number of conductive lines provided in the embodiment depicted in FIGS. 17-22. Thus, the use of separate terminals for each LED, such as depicted in FIGS. 12-16 can be replaced with an embodiment that uses a lesser number of terminals that are electrically connected to a plurality of LEDs (either in series or in parallel) such as is provided in LED assembly 702 depicted in FIGS. 23-26. Such an LED assembly will naturally provide less granularity regarding the ability to control each LED individually but will also require less connections to a supporting board, thus application level design issues will likely dictate which approach is to be used.

Thus, as can appreciated from the depicted circuits, a large degree of flexibility is enabled by the depicted features and they can be combined together so as to provide a large number of different combinations. Thus, as noted above, the particular configurations depicted, unless otherwise noted, are not intended to be limiting.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:
1. An assembly, comprising:
a frame extending in a first direction, the frame being rigid and having a length and a thickness so as to define a mounting side, the mounting side including a mounting side surface, the frame further including a top surface and a bottom surface;
a plurality of traces provided on the frame, the traces being electroplated, at least one of the plurality of traces being provided on the mounting side surface and continuing onto one of the top surface and the bottom surface; and
a semiconductor device positioned on the mounting side, the semiconductor device connected to the electroplated traces via wire bonding.
2. The assembly of claim 1, further comprising a connector integrally formed into the frame, the connector including a plurality of terminals that are electrically connected to the electroplated traces.
3. The assembly of claim 2, wherein the plurality of terminals extend out a back side of the frame.
4. The assembly of claim 3, further comprising a circuit board with a plurality of contact pads positioned on a first surface, wherein the terminals are soldered to the contact pads.
5. The assembly of claim 1, further comprising a flex member positioned in the frame, the flex member including line conductors that are electrically connected to the electroplated traces.
6. The assembly of claim 5, wherein the semiconductor device is configured to be powered by a pair of line conductors provided by the flex member.
7. The assembly of claim 1, wherein the plurality of traces provided on the frame are provided with a laser direct structuring (LDS) process and electroless plating prior to being electroplated.
8. The assembly of claim 1, wherein the plurality of traces provided on the frame are placed by a laser prior to being electroplated.
9. An assembly, comprising:
a frame extending in a first direction, the frame being rigid and having a length and a thickness and a mounting side, the mounting side including a mounting side surface, the frame further including a first side surface and a second side surface;
a plurality of traces provided on the frame, the traces being electroplated, at least one of the plurality of traces being provided on the mounting side surface and continuing onto one of the first side surface and the second side surface; and
a semiconductor device positioned on the mounting side, the semiconductor device connected to the electroplated traces via wire bonding.
10. The assembly of claim 9, wherein the frame comprises a dielectric frame.
11. The assembly of claim 9, wherein the plurality of traces provided on the frame are placed on the frame by a laser prior to being electroplated.
12. The assembly of claim 9, wherein at least one of the plurality of traces being provided on the mounting side surface continues onto both the first side surface and the second side surface.

13. The assembly of claim 9, wherein the first side surface is at least one of non-planar, curved, and non-orthogonal with respect to the mounting side surface.

14. The assembly of claim 13, wherein the at least one of the plurality of traces being provided on the mounting side surface continues onto the first side surface.

\* \* \* \* \*